(12) United States Patent
Bell et al.

(10) Patent No.: US 9,276,188 B2
(45) Date of Patent: *Mar. 1, 2016

(54) THERMOELECTRIC-BASED POWER GENERATION SYSTEMS AND METHODS

(71) Applicant: Gentherm Incorporated, Northville, MI (US)

(72) Inventors: Lon E. Bell, Altadena, CA (US);
Douglas T. Crane, Altadena, CA (US);
John LaGrandeur, Arcadia, CA (US);
David van Heerden, Glendora, CA (US)

(73) Assignee: Gentherm Incorporated, Northville, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/152,741

(22) Filed: Jan. 10, 2014

(65) Prior Publication Data

US 2014/0224291 A1    Aug. 14, 2014

Related U.S. Application Data

(63) Continuation of application No. 12/843,804, filed on Jul. 26, 2010, now Pat. No. 8,656,710.

(60) Provisional application No. 61/228,528, filed on Jul. 24, 2009, provisional application No. 61/328,958, filed on Apr. 28, 2010.

(51) Int. Cl.
*F01N 3/02* (2006.01)
*H01L 35/30* (2006.01)
(Continued)

(52) U.S. Cl.
CPC ............... *H01L 35/30* (2013.01); *F01N 3/043* (2013.01); *F01N 3/2013* (2013.01); *F01N 5/025* (2013.01);
(Continued)

(58) Field of Classification Search
USPC .......... 60/274, 275, 292, 298, 300, 320, 321, 60/324; 165/51, 52
See application file for complete search history.

(56) References Cited

U.S. PATENT DOCUMENTS

| | | |
|---|---|---|
| 2,362,259 A | 11/1944 | Findley |
| 2,363,168 A | 11/1944 | Findley |

(Continued)

FOREIGN PATENT DOCUMENTS

| | | |
|---|---|---|
| CN | 1195090 A | 10/1998 |
| CN | 1249067 A | 3/2000 |

(Continued)

OTHER PUBLICATIONS

Chinese First Office Action, and Search Report for CN Appl. No. 201080042613.1, dated Feb. 17, 2014 (w/Translation).

(Continued)

*Primary Examiner* — Binh Q Tran
(74) *Attorney, Agent, or Firm* — Knobbe Martens Olson & Bear LLP

(57) ABSTRACT

Some embodiments provide a waste heat recovery apparatus including an exhaust tube having a cylindrical outer shell configured to contain a flow of exhaust fluid; a first heat exchanger extending through a first region of the exhaust tube, the first heat exchanger in thermal communication with the cylindrical outer shell; a second region of the exhaust tube extending through the exhaust tube, the second region having a low exhaust fluid pressure drop; an exhaust valve operatively disposed within the second region and configured to allow exhaust fluid to flow through the second region only when a flow rate of the exhaust fluid becomes great enough to result in back pressure beyond an allowable limit; and a plurality of thermoelectric elements in thermal communication with an outer surface of the outer shell.

24 Claims, 24 Drawing Sheets

(51) Int. Cl.
  *F01N 3/04*   (2006.01)
  *F01N 3/20*   (2006.01)
  *F01N 5/02*   (2006.01)
  *H01L 35/32*  (2006.01)

(52) U.S. Cl.
  CPC .............. *H01L 35/32* (2013.01); *F01N 3/2053* (2013.01); *F01N 2240/14* (2013.01); *F01N 2240/36* (2013.01); *F01N 2410/02* (2013.01); *F01N 2410/10* (2013.01); *Y02T 10/16* (2013.01); *Y02T 10/26* (2013.01)

(56) References Cited

U.S. PATENT DOCUMENTS

| | | |
|---|---|---|
| 2,499,901 A | 3/1950 | Brown, Jr. |
| 2,519,241 A | 8/1950 | Findley |
| 2,938,357 A | 5/1960 | Sheckler |
| 3,004,393 A | 10/1961 | Alsing |
| 3,070,645 A | 12/1962 | Tracht |
| 3,196,620 A | 7/1965 | Elfving et al. |
| 3,197,342 A | 7/1965 | Neild, Jr. |
| 3,522,106 A | 7/1970 | Debiesse et al. |
| 3,615,869 A | 10/1971 | Barker et al. |
| 3,817,043 A | 6/1974 | Zoleta |
| 3,880,674 A | 4/1975 | Saunders |
| 3,973,524 A | 8/1976 | Rubin |
| 4,047,093 A | 9/1977 | Levoy |
| 4,056,406 A | 11/1977 | Markman et al. |
| 4,095,998 A | 6/1978 | Hanson |
| 4,125,122 A | 11/1978 | Stachurski |
| 4,211,889 A | 7/1980 | Kortier et al. |
| 4,386,596 A | 6/1983 | Tuckey |
| 4,448,028 A * | 5/1984 | Chao et al. ............... 62/3.3 |
| 4,448,157 A | 5/1984 | Eckstein et al. |
| 4,531,379 A | 7/1985 | Diefenthaler, Jr. |
| 4,595,297 A | 6/1986 | Liu et al. |
| 4,753,682 A | 6/1988 | Cantoni |
| 4,885,087 A | 12/1989 | Kopf |
| 5,228,923 A | 7/1993 | Hed |
| 5,419,780 A | 5/1995 | Suski |
| 5,419,980 A | 5/1995 | Okamoto et al. |
| 5,563,368 A | 10/1996 | Yamaguchi |
| 5,566,774 A | 10/1996 | Yoshida |
| 5,705,770 A | 1/1998 | Ogassawara et al. |
| 5,713,426 A | 2/1998 | Okamura |
| 5,917,144 A | 6/1999 | Miyake et al. |
| 6,028,263 A | 2/2000 | Kobayashi et al. |
| 6,096,966 A | 8/2000 | Nishimoto et al. |
| 6,127,766 A | 10/2000 | Roidt |
| 6,320,280 B1 | 11/2001 | Kanesaka |
| 6,367,261 B1 | 4/2002 | Marshall et al. |
| 6,541,139 B1 | 4/2003 | Cibuzar |
| 6,563,039 B2 | 5/2003 | Caillat et al. |
| 6,598,405 B2 | 7/2003 | Bell |
| 6,605,773 B2 | 8/2003 | Kok |
| 6,625,990 B2 | 9/2003 | Bell |
| 6,672,076 B2 | 1/2004 | Bell |
| 6,886,356 B2 | 5/2005 | Kubo et al. |
| 6,959,555 B2 | 11/2005 | Bell |
| 6,975,060 B2 | 12/2005 | Styblo et al. |
| 6,986,247 B1 * | 1/2006 | Parise ................ 60/284 |
| 7,100,369 B2 | 9/2006 | Yamaguchi et al. |
| 7,150,147 B2 * | 12/2006 | Murata .............. 60/287 |
| 7,231,772 B2 | 6/2007 | Bell |
| 7,273,981 B2 | 9/2007 | Bell |
| 7,380,586 B2 | 6/2008 | Gawthrop |
| 7,523,607 B2 | 4/2009 | Sullivan |
| 7,608,777 B2 | 10/2009 | Bell et al. |
| 7,629,530 B2 | 12/2009 | Inaoka |
| 7,788,933 B2 | 9/2010 | Goenka |
| 7,870,892 B2 | 1/2011 | Gawthrop |
| 7,921,640 B2 | 4/2011 | Major |
| 8,297,049 B2 | 10/2012 | Ohtani |
| 8,327,634 B2 * | 12/2012 | Orihashi et al. ........ 60/320 |
| 8,445,772 B2 | 5/2013 | Bell et al. |
| 8,495,884 B2 | 7/2013 | Bell et al. |
| 8,613,200 B2 | 12/2013 | LaGrandeur et al. |
| 8,656,710 B2 * | 2/2014 | Bell et al. ............ 60/320 |
| 8,800,263 B2 * | 8/2014 | Eder et al. ........... 60/275 |
| 2001/0029974 A1 | 10/2001 | Cohen et al. |
| 2002/0014261 A1 | 2/2002 | Caillat et al. |
| 2002/0024154 A1 | 2/2002 | Hara et al. |
| 2003/0041892 A1 | 3/2003 | Fleurial et al. |
| 2003/0140957 A1 | 7/2003 | Akiba |
| 2003/0223919 A1 | 12/2003 | Kwak et al. |
| 2004/0045594 A1 | 3/2004 | Hightower |
| 2004/0177876 A1 | 9/2004 | Hightower |
| 2004/0221577 A1 | 11/2004 | Yamaguchi et al. |
| 2004/0261831 A1 | 12/2004 | Tsuneoka et al. |
| 2004/0267408 A1 | 12/2004 | Kramer |
| 2005/0000473 A1 | 1/2005 | Ap et al. |
| 2005/0074646 A1 | 4/2005 | Rajashekara et al. |
| 2005/0105224 A1 | 5/2005 | Nishi |
| 2005/0172993 A1 | 8/2005 | Shimoji et al. |
| 2005/0194034 A1 | 9/2005 | Yamaguchi et al. |
| 2005/0217714 A1 | 10/2005 | Nishijima et al. |
| 2005/0247336 A1 | 11/2005 | Inaoka |
| 2005/0263176 A1 | 12/2005 | Yamaguchi et al. |
| 2006/0080979 A1 | 4/2006 | Kitanovski et al. |
| 2006/0118159 A1 | 6/2006 | Tsuneoka et al. |
| 2006/0130888 A1 | 6/2006 | Yamaguchi et al. |
| 2006/0157102 A1 | 7/2006 | Nakajima et al. |
| 2006/0179820 A1 | 8/2006 | Sullivan |
| 2006/0240369 A1 | 10/2006 | Duesel, Jr. et al. |
| 2007/0045044 A1 | 3/2007 | Sullivan |
| 2007/0193617 A1 | 8/2007 | Taguchi |
| 2007/0261729 A1 | 11/2007 | Hu |
| 2007/0272290 A1 | 11/2007 | Sims et al. |
| 2008/0035195 A1 | 2/2008 | Bell |
| 2008/0083445 A1 | 4/2008 | Chakraborty |
| 2008/0115818 A1 | 5/2008 | Cheng et al. |
| 2008/0283110 A1 | 11/2008 | Jin et al. |
| 2009/0038302 A1 | 2/2009 | Yamada et al. |
| 2009/0133734 A1 | 5/2009 | Takahashi et al. |
| 2009/0151342 A1 | 6/2009 | Major |
| 2009/0301539 A1 | 12/2009 | Watts |
| 2010/0024859 A1 | 2/2010 | Bell et al. |
| 2010/0095996 A1 | 4/2010 | Bell |
| 2010/0236595 A1 | 9/2010 | Bell |
| 2010/0326092 A1 | 12/2010 | Goenka |
| 2011/0067742 A1 | 3/2011 | Bell et al. |
| 2011/0185715 A1 | 8/2011 | Limbeck et al. |
| 2011/0258995 A1 | 10/2011 | Limbeck et al. |
| 2012/0073276 A1 | 3/2012 | Meisner et al. |
| 2012/0111386 A1 | 5/2012 | Bell et al. |
| 2012/0174567 A1 | 7/2012 | Limbeck et al. |
| 2012/0174568 A1 | 7/2012 | Bruck et al. |
| 2012/0177864 A1 | 7/2012 | Limbeck et al. |
| 2012/0266608 A1 | 10/2012 | Kadle et al. |
| 2013/0037073 A1 | 2/2013 | LaGrandeur |
| 2013/0068273 A1 | 3/2013 | Kanno et al. |
| 2013/0104953 A1 | 5/2013 | Poliquin et al. |
| 2013/0160809 A1 | 6/2013 | Mueller |
| 2013/0167894 A1 | 7/2013 | Brueck et al. |
| 2013/0255739 A1 | 10/2013 | Kossakovski et al. |
| 2013/0327368 A1 | 12/2013 | Crane |
| 2013/0327369 A1 | 12/2013 | Jovovic et al. |
| 2013/0340802 A1 | 12/2013 | Jovovic et al. |
| 2014/0034102 A1 | 2/2014 | Ranalli et al. |
| 2014/0096807 A1 | 4/2014 | Ranalli |
| 2014/0190185 A1 | 7/2014 | Bell et al. |

FOREIGN PATENT DOCUMENTS

| | | |
|---|---|---|
| DE | 10 2008 063 701 A1 | 6/2010 |
| DE | 10 2010 012 629 A1 | 9/2011 |
| DE | 10 2010 035 152 A1 | 2/2012 |
| DE | 10 2009 003 737 B4 | 12/2012 |
| EP | 1 174 996 A1 | 1/2002 |
| EP | 1 475 532 A2 | 11/2004 |
| EP | 1 679 480 A1 | 7/2006 |
| EP | 1 780 807 A1 | 5/2007 |
| EP | 2 180 534 A1 | 4/2010 |

(56) References Cited

FOREIGN PATENT DOCUMENTS

| | | |
|---|---|---|
| EP | 2 381 083 A1 | 10/2011 |
| EP | 2 439 799 A1 | 4/2012 |
| EP | 2 378 577 A3 | 12/2012 |
| EP | 2 541 634 A1 | 1/2013 |
| EP | 2 313 938 B1 | 10/2013 |
| FR | 2 512 499 | 10/1984 |
| JP | 59-097457 | 6/1984 |
| JP | 05-195765 | 8/1993 |
| JP | 05-219765 | 8/1993 |
| JP | 06-038560 | 2/1994 |
| JP | 07-074397 | 3/1995 |
| JP | 07-111344 | 4/1995 |
| JP | 07-156645 | 6/1995 |
| JP | 08-098569 | 4/1996 |
| JP | 09-275692 | 10/1997 |
| JP | 10-163538 | 6/1998 |
| JP | 11-032492 | 2/1999 |
| JP | 11-201475 | 7/1999 |
| JP | 11-274575 | 10/1999 |
| JP | 11-041959 | 12/1999 |
| JP | 2000-018095 | 1/2000 |
| JP | 2000-208823 | 7/2000 |
| JP | 2002-21534 | 7/2000 |
| JP | 2000-286469 | 10/2000 |
| JP | 2000-323759 | 11/2000 |
| JP | 2001-210879 | 8/2001 |
| JP | 2002-111078 | 4/2002 |
| JP | 2002-199761 | 7/2002 |
| JP | 2002-325470 | 11/2002 |
| JP | 2003-086223 | 3/2003 |
| JP | 2003-175720 | 6/2003 |
| JP | 2003-259671 | 9/2003 |
| JP | 02003314366 A * | 11/2003 ..................... 60/320 |
| JP | 2004-332596 | 11/2004 |
| JP | 2004-343898 | 12/2004 |
| JP | 2004-360522 | 12/2004 |
| JP | 2004-360681 | 12/2004 |
| JP | 2005-212564 | 8/2005 |
| JP | 2006-214350 | 8/2006 |
| JP | 2006-250524 | 9/2006 |
| JP | 2008-042994 | 2/2008 |
| JP | 2008-274790 | 11/2008 |
| JP | 2008-546954 | 12/2008 |
| JP | 2009-010138 | 1/2009 |
| JP | 2009-033806 | 2/2009 |
| RU | 2099642 C1 | 12/1997 |
| RU | 2174475 C2 | 10/2001 |
| WO | WO 95/20721 | 8/1995 |
| WO | WO 98/50686 | 11/1998 |
| WO | WO 02/081982 | 10/2002 |
| WO | WO 03/104726 | 12/2003 |
| WO | WO 2004/019379 | 3/2004 |
| WO | WO 2004/059139 | 7/2004 |
| WO | WO 2005/020422 | 3/2005 |
| WO | WO 2005/098225 | 10/2005 |
| WO | WO 2006/064432 | 6/2006 |
| WO | WO 2007/002891 | 1/2007 |
| WO | WO 2008/042077 | 4/2008 |
| WO | WO 2008/091293 | 7/2008 |
| WO | WO 2008/123330 | 10/2008 |
| WO | WO 2010/135173 | 11/2010 |
| WO | WO 2012/031980 | 3/2012 |
| WO | WO 2012/045542 | 4/2012 |
| WO | WO 2012/170443 | 12/2012 |

OTHER PUBLICATIONS

Crane, D. T.: "Progress Towards Maximizing the Performance of a thermoelectric Power Generator", ICT '06, 25th, USA, IEEE, Aug. 1, 2006, 11-16I.

Fleurial, et al., "Development of Segmented Thermoelectric Multicopule Converter Technology," Aerospace Conference, 2006 IEEE Big Sky, Mt., Mar. 4-11, 2006, pp. 1-10.

Funahashi et al., "Preparation and properties of thermoelectric pipe-type modules," Thermoelectrics, 2006. ICT '06. 25th International Conference on Aug. 6-10, 2006.

Funahashi, et al., "A portable thermoelectric-power-generating module composed of oxide devices," Journal of Applied Physics 99, 066117 (2006).

Ikoma, K., et al., "Thermoelectric Module and Generator for Gasoline Engine Vehicles," 17$^{th}$ Int'l Conf. on Thermo-electrics, Nagoya, Japan, pp. 464-467 (1998).

International Search Report and Written Opinion dated Dec. 16, 2013, Application No. PCT/US2013/022299, filed Jan. 18, 2013 in 15 pages.

International Search Report and Written Opinion re Application No. PCT/US2013/052776, mailed Mar. 17, 2014.

International Preliminary Report on Patentability dated Jun. 12, 2012, International Application No. PCT/US2010/043278 in 23 pages.

International Search Report and Written Opinion dated Dec. 29, 2011, International Application No. PCT/US2010/043278.

Menchen, et al., "Thermoelectric Conversion to Recover Heavy Duty Diesel Exhaust Energy", Proceedings of the Annual Automotive Technology Development Contractors Meeting, pp. 445-449, Apr. 1991.

Min et al., "Ring-structured thermoelectric module," Semiconductor Science and Technology, Semicond. Sci. Technol. 22 (2007) 880-8.

Snyder, G. Jeffrey, et al., "Thermoelectric Efficiency and Compatibility," The American Physical Society, Oct. 2, 2003, vol. 91, No. 14.

Snyder, G. Jeffrey, "Application of the compatibility factor to the design of segmented and cascaded thermoelectric generators" Applied Physics Letters, AIP, American Institutes of Physics, Melville, NY, vol. 84, No. 13, Mar. 29, 2004, pp. 2436-2438, XPO12060957 ISSN: 0003-6951 the whole document.

Stockholm, John G.: "Large-Scale Cooling: Integrated Thermoelectric Element Technology," CRC Handbook of Thermoelectrics, Chapter 53, pp. 657-666. 0-8493-0146, Jul. 1995.

Thermoelectrics Handbook: Macro to Nano, Thermoelectric Module Design Theories, 11.7 Ring-Structure Module, pp. 11-11 to 11-15.

Ursell, T.S. et al., "Compatibility of Segmented Thermoelectric Generators," 21st International Conference on Thermoelectronics, 2002, p. 412-417.

Chinese Second Office Action for CN Appl. No. 201080042613.1, issued Aug. 27, 2014 (w/Translation).

Japanese Rejection Notice for JP Appl. No. 2012-521880, issued Aug. 29, 2014 (w/translation).

* cited by examiner

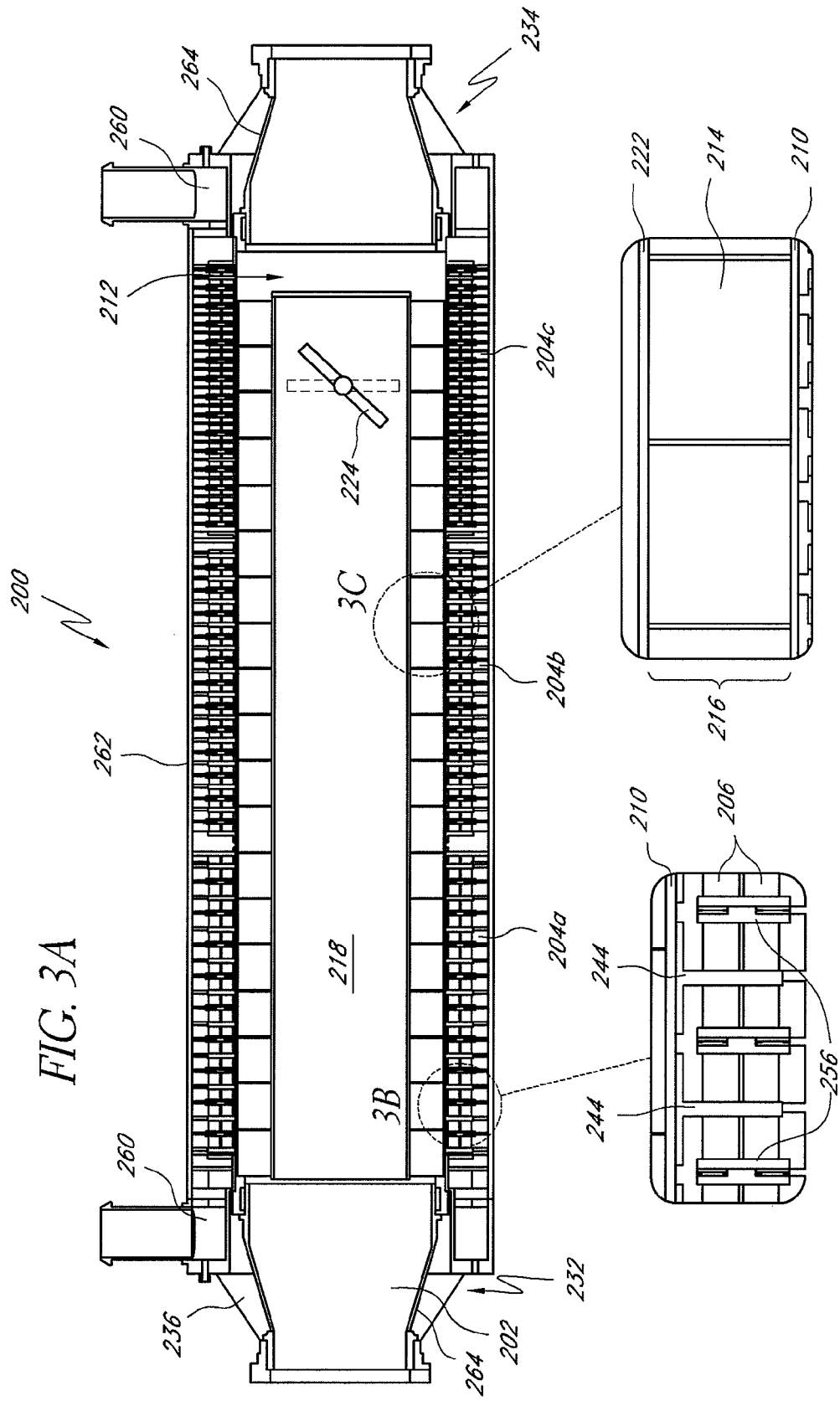

THERMOELECTRIC-BASED POWER GENERATION SYSTEMS AND METHODS

RELATED APPLICATIONS

This application is a continuation of U.S. patent application Ser. No. 12/843,804 filed Jul. 26, 2010, which claims the benefit under 35 U.S.C. §119(e) of U.S. Provisional Appl. No. 61/228,528, filed Jul. 24, 2009, and U.S. Provisional Appl. No. 61/328,958, filed Apr. 28, 2010. The entire contents of each of the above-identified applications are incorporated by reference herein and made part of this specification.

BACKGROUND

1. Field

This application relates to power generation technology and, in particular, to power generation using thermoelectric devices.

2. Description of Related Art

Power equipment commonly produces waste heat in addition to a desired output. For example, a vehicle power plant typically converts fuel energy into mechanical energy and waste heat. At least a portion of the waste heat is often removed from the power plant through an exhaust system. Additional processing of exhaust after its removal from the power plant, including chemical reactions and emissions reduction techniques, can further heat the exhaust and increase the amount of waste heat. For a vehicle having a combustion engine, the exhaust system usually includes tubing that carries exhaust gases away from a controlled combustion inside the engine. The exhaust gases and waste heat can be carried along an exhaust pipe and expelled into the environment.

High temperature thermoelectric (TE) power generation has been viewed as the act of attaching off-the-shelf thermoelectric modules onto the side of a structure that provides a source of heat. Such thermoelectric generators (TEGs) have not met with commercial success because these devices are not very efficient or flexible in their operation.

SUMMARY

Some embodiments provide a waste heat recovery apparatus including an exhaust tube having a cylindrical outer shell configured to contain a flow of exhaust fluid; a first heat exchanger extending through a first region of the exhaust tube, the first heat exchanger in thermal communication with the cylindrical outer shell; a second region of the exhaust tube extending through the exhaust tube, the second region having a low exhaust fluid pressure drop; an exhaust valve operatively disposed within the second region and configured to allow exhaust fluid to flow through the second region only when a flow rate of the exhaust fluid becomes great enough to result in back pressure beyond an allowable limit; and a plurality of thermoelectric elements in thermal communication with an outer surface of the outer shell, the thermoelectric elements configured to accommodate thermal expansion of the exhaust tube during operation of the waste heat recovery system.

In some embodiments, the apparatus can include a coolant conduit in thermal communication with the plurality of thermoelectric elements, the coolant conduit comprising an inner tube and an outer tube in thermal communication with one another. The outer tube can have a greater diameter than the inner tube and include expansion joints configured to accommodate dimensional changes due to thermal expansion between the cylindrical outer shell and the coolant conduit. The exhaust tube can include no expansion joints for accommodating dimensional changes due to thermal expansion.

Additional embodiments provide a waste heat recovery apparatus including an exhaust tube configured to contain a flow of exhaust fluid, the exhaust tube having a high temperature end, a low temperature end opposite the high temperature end, and a middle section between the high temperature end and the low temperature end during operation of the waste heat recovery apparatus; a first plurality of thermoelectric elements connected to the high temperature end; a second plurality of thermoelectric elements connected to the middle section; and a third plurality of thermoelectric elements connected to the low temperature end. The second plurality of thermoelectric elements can be longer than the third plurality of thermoelectric elements, and the first plurality of thermoelectric elements can be longer than the second plurality of thermoelectric elements.

Further embodiments provide a waste heat recovery apparatus including an cylindrical exhaust tube configured to contain a flow of exhaust fluid; a bypass region extending through the exhaust tube, the bypass region having a low exhaust fluid pressure drop; a coolant conduit configured to contain a flow of coolant within a first tube, the coolant conduit comprising a second tube enclosing at least a portion of the first tube and a conductive material disposed between the first tube and the second tube; a first shunt extending from the exhaust tube; a second shunt extending from the coolant conduit and in thermal communication with the second tube; and a thermoelectric element thermally connected between the first shunt and the second shunt. The first shunt can be held against the exhaust tube by a tensioned hoop extending around the perimeter of the exhaust tube.

In certain embodiments, a thermoelectric system is provided. The thermoelectric system can include a plurality of thermoelectric elements, and at least one cooler side shunt and at least one hotter side shunt in thermal communication with at least one of the plurality of thermoelectric elements. The thermoelectric system can further include at least one heat exchanger in thermal communication and physically integrated with the at least one hotter side shunt, and the at least one heat exchanger can be substantially electrically isolated from the at least one thermoelectric element. In some embodiments, the at least one hotter side shunt is physically coupled with the at least one heat exchanger. In certain embodiments, the at least one heat exchanger is in close physical proximity to the plurality of thermoelectric elements, such that cooling power, heating power, or power generation from the thermoelectric elements that is lost from ducting and other components that slow warm up or light off is reduced. In further embodiments, the at least one heat exchanger has a honeycomb structure. The thermoelectric system can also include at least one alternative flow path configured to reduce heat transfer between at least one working media and the at least one heat exchanger in certain embodiments.

In certain embodiments, a catalytic converter is provided. The catalytic converter can include a plurality of the thermoelectric systems. The catalytic converter can also include at least one controller configured to individually control each of the plurality of thermoelectric systems, and at least one sensor in communication with the at least one controller and configured to measure at least one operating parameter of the catalytic converter. The at least one controller can adjust electrical power sent to the plurality of thermoelectric systems in response to the at least one operating parameter.

In certain embodiments, a thermoelectric generator is provided. The thermoelectric generator can include at least one heat exchanger and at least one combustor physically integrated into the at least one heat exchanger. The thermoelectric generator can also include at least one hotter side shunt physically integrated and in thermal communication with the at least one heat exchanger, and at least one cooler side shunt. At least one thermoelectric element can be sandwiched between the at least one hotter side shunt and the at least one cooler side shunt, and the at least one heat exchanger can be substantially electrically isolated from the at least one thermoelectric element.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Any feature or structure can be removed or omitted. Throughout the drawings, reference numbers may be reused to indicate correspondence between reference elements.

FIG. 3A is a cut-away view of an exhaust heat recovery system.

FIG. 3B is a cross-sectional view of a thermoelectric element assembly.

FIG. 3C is a cross-sectional view of a heat exchange assembly.

DETAILED DESCRIPTION

Figure 1:
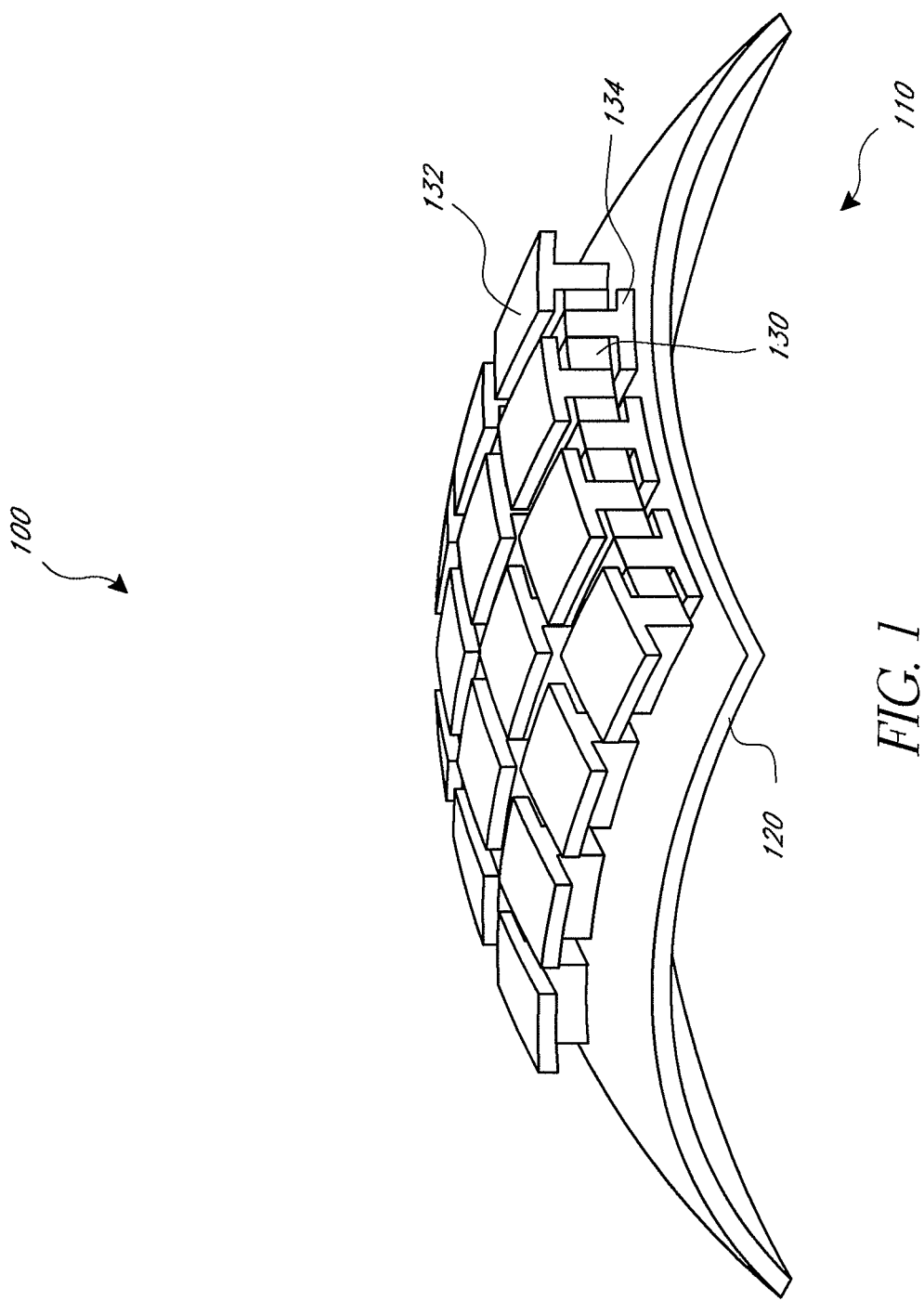
FIG. 1 depicts an embodiment of a power generation system.

Although certain preferred embodiments and examples are disclosed herein, inventive subject matter extends beyond the examples in the specifically disclosed embodiments to other alternative embodiments and/or uses, and to modifications and equivalents thereof. Thus, the scope of the claims appended hereto is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components. For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

Thermoelectric-based power generators can be used in a variety of ways in industrial, commercial, residential, automotive, marine, aviation, and other applications. For example, performance advances in power generation thermoelectric materials and government mandates for $CO_2$ emission reductions have led to increased interest in waste heat recovery systems. In particular, a waste heat recovery system that meets the requirements of the passenger vehicle, van and truck markets is desired. Preferred designs are rugged, reliable, capable of providing stable operation for at least 15 years, and cost effective. In some embodiments, a waste recovery system operates in the exhaust stream at temperatures up to 700° C. to accommodate a broad range of mass flows and is of sufficiently high efficiency to make an important contribution to $CO_2$ emissions reductions.

Described herein are thermoelectric power generation embodiments that addresses one or more of the following: differential thermal expansion between hot and cold sides of a TE device, thermal interface treatments, electrical isolation and redundancy, varying temperatures and mass flow rates, TE components, environmental protection, and/or design for manufacturability. Laboratory test results show that the disclosed system designs are unexpectedly effective. A waste heat recovery system positioned in the exhaust system can meet automotive requirements and can provide useful amounts of electrical power under common driving conditions.

Many governments are requiring that the transportation industry actively address fossil fuel consumption and reduce emissions including $CO_2$ and other greenhouse gases. Most $CO_2$ initiatives, such as those in the European Community, China, Japan and the USA, require decreasing allowable levels of emissions and fuel consumption by a target date. Some embodiments address these mandates by increasing efficiency and controlling greenhouse gas emissions. The embodiments disclosed herein have been found effective as a source for large efficiency gains from the introduction of a single subsystem. The ability of such systems to have a large performance impact and the complexity and cost of system integration have been barriers for at least some previous waste heat recovery technologies to overcome. For example, these barriers have been present in systems based on two phase fluid (e.g., the Rankine cycle) or solid state waste heat recovery technology.

Several factors combine to make solid state thermoelectric systems attractive. First, vehicles are becoming more electrified as part of automobile companies' strategy to reduce emissions through the use of smarter subsystems such as engine off operation during deceleration and at rest, and the adoption of electrified subsystems including brakes (regeneration and actuation), steering systems, fuel pumps, thermal management subsystems (e.g., PTC heaters) and other equipment. These changes reduce $CO_2$ emissions, but on average consume more electric power throughout the drive cycle. Further, electric power loads vary significantly during city drive cycles, so that electrical storage capacity is more important and flow of increased electrical power has to be managed. Some embodiments address these factors by converting waste heat directly to electric power, as opposed to mechanical power output.

Some embodiments incorporate thermoelectric (TE) materials exhibiting improved performance. Improved TE material performance can result from advances including an increase in power factor and a reduction in thermal conductivity in mid temperature (300° C. to 600° C.) materials. Some embodiments incorporate TE materials that employ reduced thermal conductivity techniques in low temperature (0° C. to 300° C.) materials. The improved TE materials can increase the amount of electric power produced from waste heat so as to have a larger contribution to efficiency gain, and in doing so, not add to system complexity or size. Thus, costs per watt of electrical power output can decrease. Further cost reductions have been demonstrated by incorporating system design technology that uses less TE material.

Some embodiments perform one or more of the following functions:

1. Harvest waste heat efficiently under a wide range of driving conditions from the exhaust system (as opposed to engine coolant).
2. Do not degrade present engine performance, either under normal drive cycle conditions or in the case of device failure.
3. Achieve significant direct operational performance gains and utilize interactions with other vehicle systems to further increase performance (e.g., faster engine warm up which increases efficiency and accelerates occupant heating time to comfort while using the engine coolant system as the cold heat rejection side).
4. Replace or integrate with existing components such as catalytic converter, muffler, and/or exhaust gas recirculation (EGR) systems to increase efficiency and reduce weight, volume and cost.
5. Demonstrate a pathway to volume production and end of life recycling of TE materials and other major components.

FIG. 1 depicts an embodiment of a power generation system 100 incorporating a plurality of thermoelectric (TE) elements 130. The power generation system 100 may be a component of a larger system, and may be configured to provide electrical power to aid in the operation of the larger system, or otherwise increase performance, or control the operation of the larger system. The power generation system 100 may assist, affect, or control one or more systems in which it is in functional communication. In certain embodiments, the power generation system 100 is combined with another structure sharing internal components, thereby resulting in a reduced number of parts.

The system 100 includes a heat source and/or a high temperature region 110 in thermal communication with a wall 120. The temperature of the region 110 can depend on the type of the heat source, a heat transfer medium, and other factors and can vary during operation of the system 100 or be substantially stable. In certain embodiments, a power generation system 100 is configured to operate in the presence of temperatures of up to 700° C., or higher. The heat source may be, for example, a heated fluid, either stagnant or flowing. Thermal energy from a heated fluid may transfer to the wall 120 via direct physical contact with the wall 120, indirect contact with the wall 120, conduction, convection, and so forth. Thermal energy transfer to the wall 120 may also occur through radiation or other processes.

In some embodiments, a fluid heat source flows in proximity to the wall 120, such that thermal energy transfer is aided by convection. The source of thermal energy may be, for example, waste heat from power equipment. As another example, the heat source may be one or more chemical reactions, taking place in a reaction chamber, or otherwise. The heat source may be contained in an enclosure or some structure that restricts or directs the dissipation of thermal energy from the heat source. For example, the heat source may be contained within a pipe, chamber, duct, or other enclosure. The wall 120 can form at least a portion of the enclosure of the heat source. Advantageously, thermal energy is directed from the heat source to the wall 120 so that the thermal energy can be used for electric power generation. For example, the heat source can cause a thermal gradient to exist across one or more TE elements of a TE generator. The TE generator can be thermally coupled to the heat source in any suitable fashion to provide high thermal conductivity between the heat source and the hot side of the TE elements 130.

The wall 120 may be any type of wall, such as that of a duct, pipe, reaction chamber, heat exchanger, or housing. The wall 120 can be connected to heat exchange fins, a structure configured to increase the surface area of the wall, another heat exchange structure, or a combination of structures. In some embodiments, the wall 120 can include one or more integrated heat exchange structures. The wall 120 can be configured in any suitable way to facilitate the transfer of thermal energy between the high temperature region 110 and a heat exchange structure that directs thermal energy to the TE elements 130. The wall 120 may be flat, or, as depicted in FIG. 1, may be curved, concave, irregular, or have another shape.

In certain embodiments, the system 100 uses high power density TE element designs, stack TE element designs, or any other suitable TE element design. Certain embodiments comprise electrically separated banks of TE elements 130. The embodiment of FIG. 1 depicts cold-side 132 and hot-side 134 shunts in thermal connection with TE elements 130 in a stack design. At least some TE module configurations employing stack designs may provide various benefits, including, for example, improved comprehensive loads for thermal and electrical interfaces as well as tailored n and p type element geometries for improved efficiency.

Groups of shunts 132, 134 may be electrically connected in series/parallel arrangements to achieve a suitable balance of reliability and operating voltage. The shunts can have provisions to attach multiple TE elements 130 in groups to achieve TE element stability, longevity, and reliability. In some embodiments, differences between the thermal power density of a hot side heat exchanger and the thermal power density of a cold side heat exchanger are reduced or minimized. For example, the shunts 132, 134 can be configured to match the thermal power density of the hot and cold side heat exchangers. Thermal energy from the wall 120 can transfer to the thermoelectric elements 130 via the hot-side shunts 134. Thermal energy of the cold-side shunts 132 can be dissipated or reduced using any suitable technique, including heat exchange fins exposed to ambient air, a circulatory cooling system, another cooling structure, or a combination of techniques.

Various techniques can be employed to thermally and mechanically connect the shunts 132, 134 to the wall 120, to the TE elements 130, or to other structures of the system 100. For example, high temperature glasses, ceramic adhesives, mechanical locking (using slots, pins or the like), braising, welding, fastening (screws, bolts, or the like), clips, brackets, another connection technique, or a combination of techniques may be used. Shunts may also be secured by a band or other structure that circumferentially extends around the wall 120. In certain embodiments, the hot-side shunts are electrically isolated from the wall 120. In other embodiments, the shunts are not electrically isolated from the wall 120, and the shunts can incorporate integrated electrical isolation.

The TE elements 130 may be arranged in close proximity to each other, thereby facilitating electrical connections at interfaces between TE elements 130 and creating an electrical network. In some cases, thermal expansion can impair joint security and conductivity at interfaces between TE elements 130. In some embodiments, connecting joints between adjacent TE elements or connecting joints between TE elements and shunts can be configured to reduce or minimize undesired effects of thermal expansion. For example, the length, composition, shape, number and size of TE elements can be selected to adjust output, operating temperatures, working fluids, and other properties in response to different operating environments. In certain embodiments, groups of TE elements 130 are connected in a manner that permits individual TE elements or groups of TE elements to be replaced or disassembled without de-soldering or de-braising. In some embodiments, at least certain types of seals are not in thermal proximity to the high temperature region 110. Instead, sealing materials that may melt in the presence of high temperatures can be separated, insulated, and/or thermally isolated from the high temperature region 110 and other high-temperature components of the system 100.

The TE elements 130 can include any suitable TE material and can be configured to generate electrical power in response to an applied temperature gradient across the material. Some embodiments incorporate TE materials exhibiting improved performance. Improved TE material performance can result from advances including an increase in power factor and a reduction in thermal conductivity in mid temperature (300° C. to 600° C.) materials. Some embodiments incorporate TE materials that employ reduced thermal conductivity techniques in low temperature (0° C. to 300° C.) materials. The improved TE materials can increase the amount of electric power produced from waste heat so as to have a larger contribution to efficiency gain, and in doing so, not add to system complexity or size. Thus, costs per watt of electrical power output can decrease. Further cost reductions have been demonstrated by incorporating system design technology that uses less TE material.

The TE element interfaces at hot and cold side surfaces may include compliant members, such as screens, cintered metal structures, metal foils, embossed foils, high temperature electrically conductive grease, or other suitable members, to reduce tensile and shear stress experienced at the interfaces. The compliant members can be compression fit, bonded, or attached by locking details in the mating surfaces. In addition, the interfaces may be held in compression by the application of external forces such as through the use of compliant flexures that transmit electric current with low interfacial losses.

The cold side of the TE modules can be in thermal connection with a cooling fluid that is generally cooler than the high temperature region 110, creating a temperature gradient between the hot side and the cold side of the TE elements 130. The cooling fluid may be ambient air, liquid coolant, another flowing or stagnant fluid, or a combination of fluids. The cooling fluid may be contained within a conduit or channel, and fluid may be directed through such conduit or channel to establish substantial thermal contact with the TE elements 130, facilitating the transfer of thermal energy between the cold side of the TE elements 130 and the cooling fluid. The thermal energy can be transferred via one or more cold-side shunts 132. The flow or pressure of fluid in thermal contact with the TE elements 130 may be affected by a flow regulator, such as a fan, pump, valve, fluid bypass, or other means or combination of means. Movement of the fluid can increase the transfer rate of thermal energy from the TE elements 130 to the fluid, thereby increasing the temperature differential between the hot side and the cold side of the TE elements. A heat exchanger may likewise increase the transfer of thermal energy between the cold side of the TE elements and the fluid. For example, fins may increase the surface area from which thermal energy may escape into the surrounding fluid.

As the components of the system 100 experience fluctuations in temperature over time as a result of, among other things, exposure to a heat source and cooling fluid, the components may undergo varying amounts thermal expansion. The amount of thermal expansion experienced by the components of the system 100 may depend on the thermal configuration of the system and the materials from which the components are constructed. The components may be constructed from any suitable material or combination of materials, including materials that have relatively high coefficients of thermal expansion, such as certain metals. The hot and cold sides of the system 100 may experience significantly disparate degrees of thermal expansion, and the system 100 can be configured to substantially maintain a high level of performance in widely varying thermal configurations.

In some embodiments, the shunts 132, 134 are configured to direct thermal energy flow through the system 100 such that the thermal gradient across the TE elements 130 is in a direction that is away from normal. For example, the shunts can use a "T"-configuration as shown in FIG. 1 such that the thermal gradient is generally or more nearly parallel to the wall 120. In such a configuration, changes in dimensions of components due to temperature variation can occur while changes in gaps between TE elements 130 and other system components are reduced or eliminated. Further, the outer surfaces of the thermoelectric generator can be treated with a high thermal conductivity, electrically insulating coating that is stable over the entire fabrication and operating temperature range.

Figure 2:
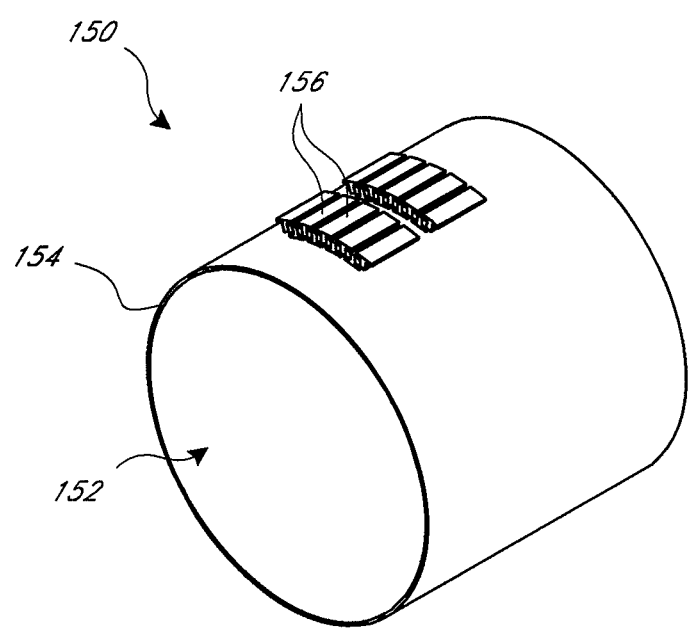
FIG. 2 depicts another embodiment of a power generation system.

FIG. 2 illustrates another embodiment of a power generation system 150. The embodiment shown in FIG. 2 includes a generally cylindrically shaped wall 154 that at least partially surrounds a high temperature region 152. The high temperature region can be connected to a heat source or can include a heat source. For example, a fluid can flow within an enclosed conduit formed by the cylindrically shaped wall 154. One or more TE elements 156 can be arranged longitudinally along the circumference of the wall 154. In the embodiment shown in FIG. 2, an array of TE elements 156 surrounds a portion of the cylindrically shaped wall 154, although it is understood that the TE elements 156 can extend fully around the wall 154 and can be configured to substantially cover the outer surface of the wall 154.

In some embodiments, a heat exchanger (not shown) can be disposed at least partially within the high temperature region 152 to facilitate the transfer of thermal energy from the high temperature region 152 towards the TE elements 156. The heat exchanger can be attached to the wall 154 or the TE elements 156 by any technique providing good heat transfer. In certain embodiments, the heat exchanger is integrated into the wall 154.

The space inside the generally cylindrically shaped wall 154 may be partitioned into one or more fluid conduits. The one or more fluid conduits can be configured to regulate the flow of fluid through the high temperature region 152 or other areas inside the wall 154. In some embodiments, a power generation system 150 can use multiple cylinders to scale capacity, meet form factor requirements, reduce cost, or for any other reason. In certain embodiments, the system 150 includes a wall that is not cylindrical; instead, the high temperature region can be at least partially surrounded by a wall having the shape of an oval, an ellipsoid, a star, a cone, a spiral, a polygon, another shape, or a combination of shapes.

Embodiments of thermoelectric generators (TEGs) disclosed herein are described with reference to one or more particular applications, such as exhaust system heat recovery. At least some of the disclosed embodiments or aspects of the disclosed embodiments can be applied in other applications or environments where thermal energy can advantageously be converted into electrical energy.

Figure 4B:
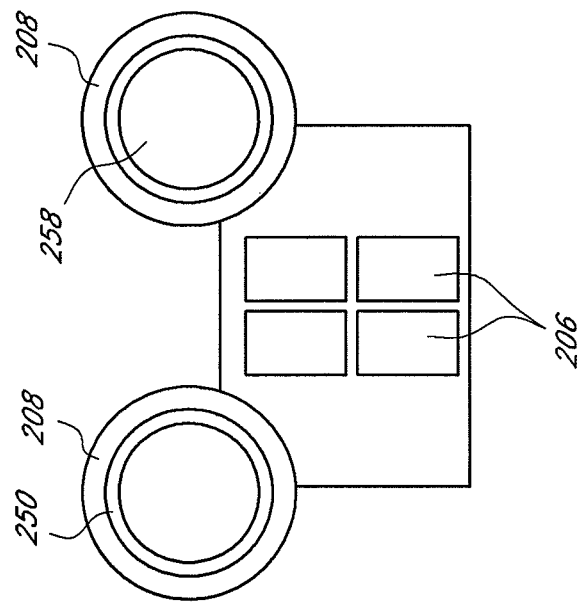
FIG. 4B is a cross-sectional end view of a cold side heat exchanger.
Figure 4A:
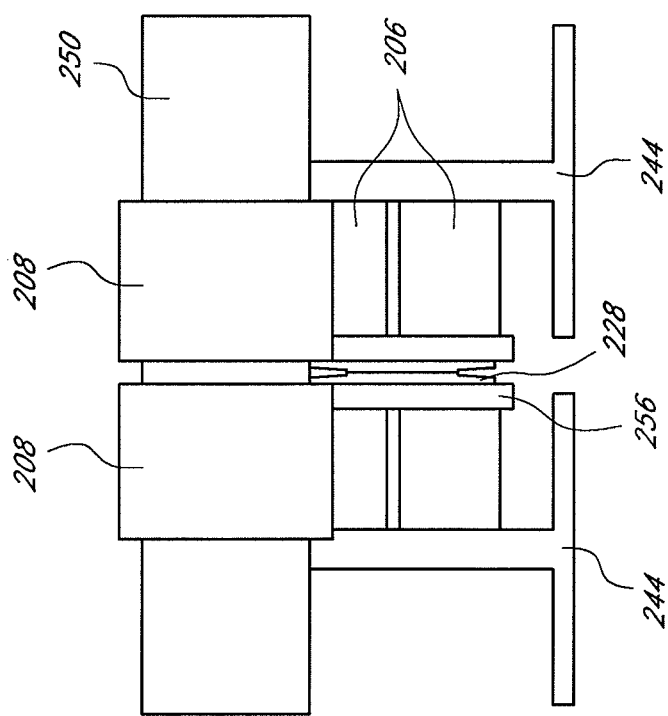
FIG. 4A is a cross-sectional side view of a cold side heat exchanger.
Figure 5:
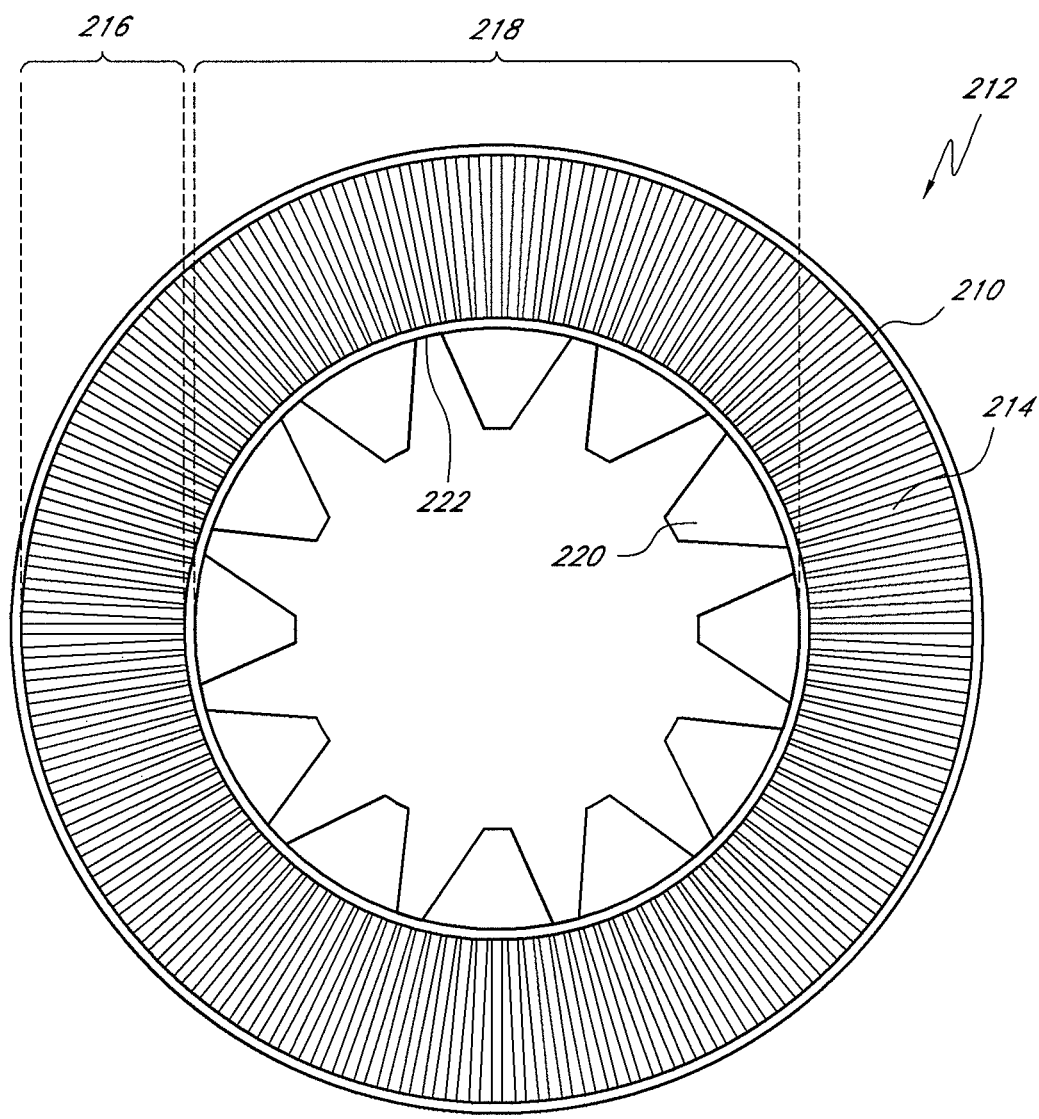
FIG. 5 is a cross-sectional end view of a heat transfer enhancement system within an exhaust tube.
Figure 21:
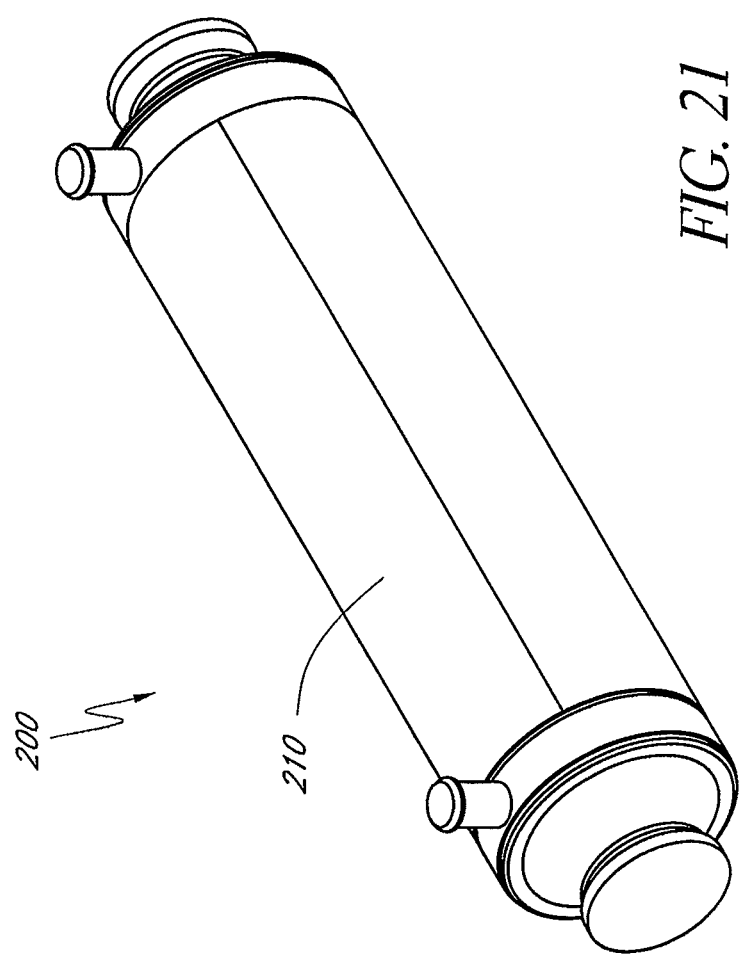
FIG. 21 is a perspective view of the exhaust heat recovery system shown in FIG. 3A.

FIG. 3A depicts an embodiment of an exhaust heat recovery system 200 employing a TEG. The system 200 includes a shell 210 that can be generally cylindrically shaped, with hot exhaust ducted through an inner chamber 202, and arrays 204a-c of TE elements 206 surrounding a portion of the shell 210. FIG. 21 is a perspective view showing the generally cylindrical configuration of the TEG system 200. While the shell 210 of the exhaust tube 212 shown is cylindrical, it is understood that other suitable tube geometries can be used. Cold side heat exchangers 208, shown in FIGS. 4A and 4B, are external to the hot side shell 210 and provide cooling and waste heat removal. The exhaust tube 212 has an internal heat exchanger 214, as shown in FIG. 5, to enhance heat transfer from the exhaust stream. A peripheral area (or first region 216) inside the cylinder may contain a relatively dense heat transfer area heat exchanger 214. The central portion of the exhaust tube 212 may have a second region 218 with low exhaust fluid pressure drop. The second region 218 can act as a bypass if the exhaust fluid flow rate becomes great enough to result in back pressure beyond an allowable limit.

In some embodiments, the central portion 218 has a heat transfer enhancement structure 220 within the bounds of allowable pressure drop, as illustrated in FIG. 5. A heat transfer structure 220 within the second region 218 can be substantially less dense than the heat transfer area heat exchanger 214. A sleeve 222 can separate the two flow paths within the exhaust tube 212 to better direct and control heat transfer from the exhaust fluid. The illustrated embodiment can be modified and scaled by adjusting the diameters and/or relative sizes of the shell 210 and the inner sleeve 222 of the exhaust tube 212. Also, the lengths, composition, shape, number and size of TE elements 206 outside the tube 212 can be selected to scale output and other properties, such as operating temperatures and various working fluids, and to respond to different operating environments. Further, multiple tubes (not shown) can be used to scale capacity, meet form factor requirements, reduce cost, or for any other reason. Some embodiments include cylinders in oval, ellipsoidal, star, conical, spiral or any other generally cylindrical shape.

Figure 7:
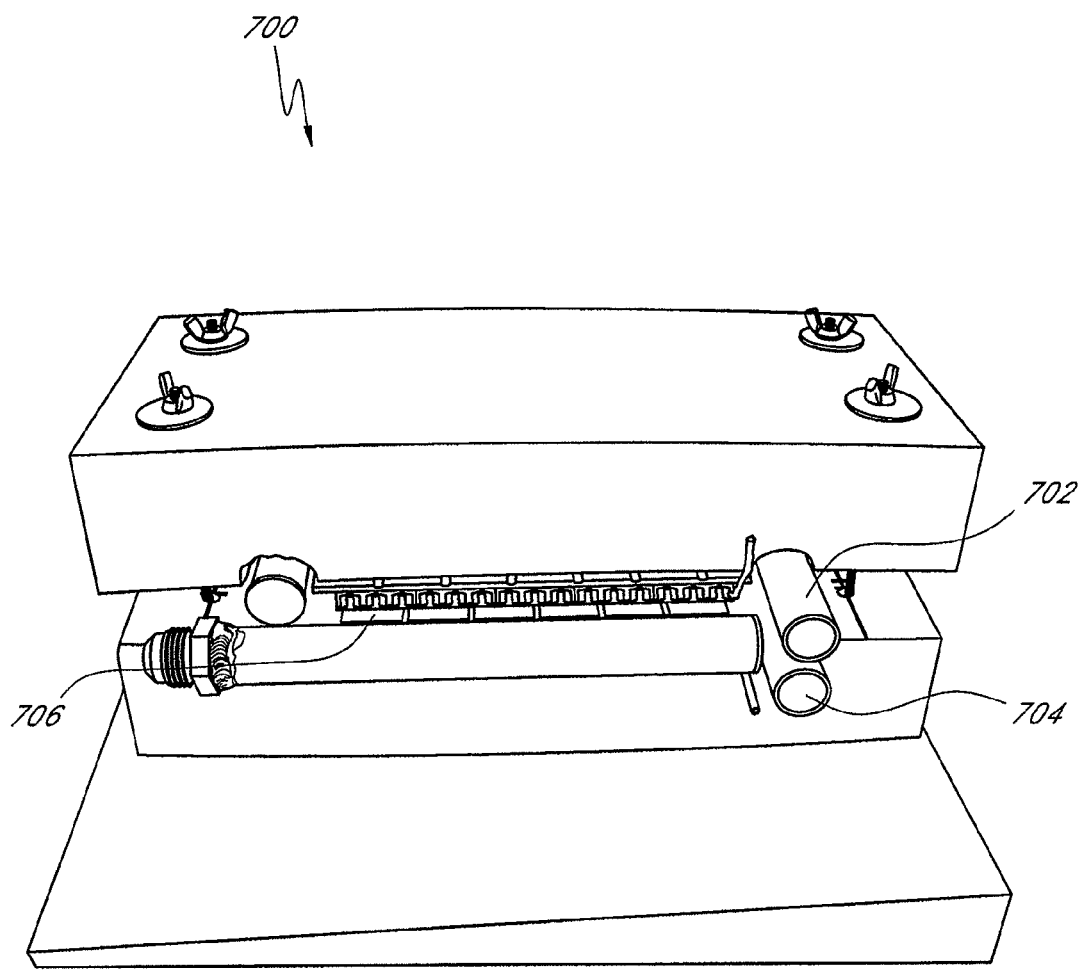
FIG. 7 shows an embodiment of a flat thermoelectric generator.

In the following description, features of some embodiments are discussed and solutions to unexpected design challenges are disclosed. Some of the features that make the design successful are applicable to flat thermoelectric generator (TEG) configurations such as the one shown in FIG. 7. Some embodiments include a flat TEG 700 that uses the improvements described herein. A flat TEG 700 can include a hot working fluid conduit network 702 and a cold working fluid conduit network 704. One or more TE elements 706 can be disposed between the working fluid conduit networks 702, 704. The TE elements 706 can be arranged in one or more substantially planar levels.

Figure 8C:
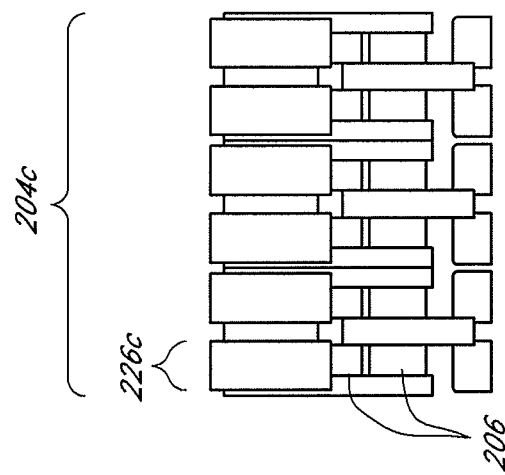
FIG. 8C is a schematic diagram of thermoelectric elements at a low temperature end of an exhaust heat recovery system.
Figure 8B:
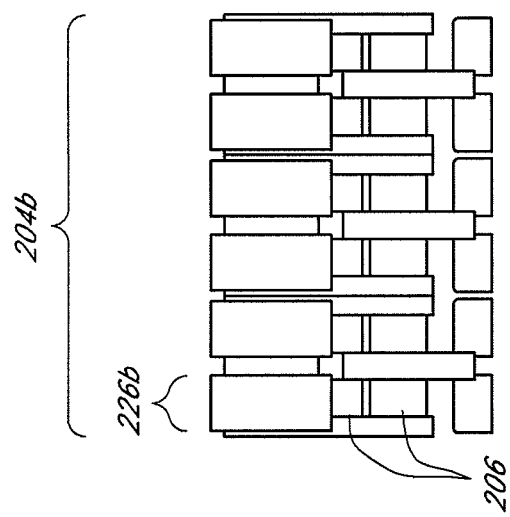
FIG. 8B is a schematic diagram of thermoelectric elements at a middle section of an exhaust heat recovery system.
Figure 8A:
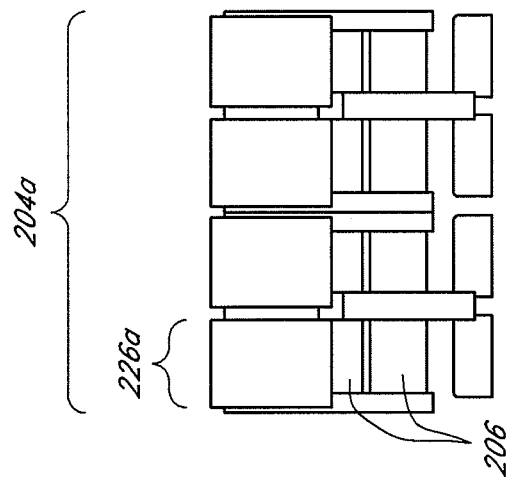
FIG. 8A is a schematic diagram of thermoelectric elements at a high temperature end of an exhaust heat recovery system.

A TEG 200 can have a variety of control features. Some control features can affect operation of the TEG 200 itself. For example, a controller can be configured to actuate one or more valves 224 disposed inside the second region 218 of the exhaust tube 212. The one or more valves 224 can be configured to apportion exhaust fluid flow within the tube 212, as shown in FIG. 3A. As another example, sections 204a, 204b, 204c of TE elements 206 can have independent electrical power outputs, as shown in FIGS. 8A, 8B and 8C. The TE elements 206 can extract more or less thermal power from the fluid stream and vary the temperature drop in at least part of the fluid as it passes through at least a portion of the TEG 200. A TEG can affect, influence, and/or control the operation of other systems. For example, the TEG can assist in noise reduction to replace or complement mufflers, increase the speed of occupant and/or engine warm up, perform catalytic converter warm up and temperature control, perform heat transfer to an engine coolant system, implement electrical energy functionality (for example, output power, voltage, usage and control), control EGR gas temperature, and assist in any other control or interaction that can be integrated and/or placed in functional communication with the TEG.

Figure 9:
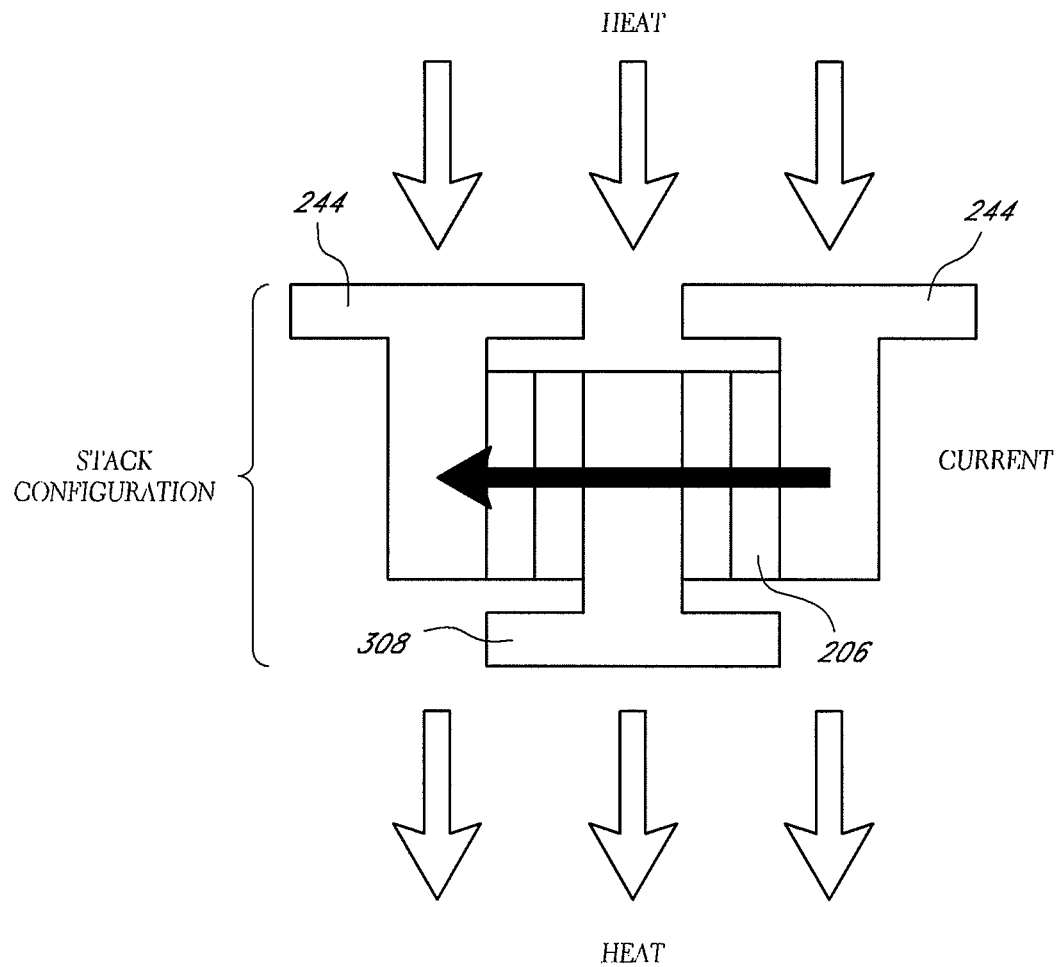
FIG. 9 is a schematic diagram of a thermoelectric element in a stack configuration.
Figure 11A:
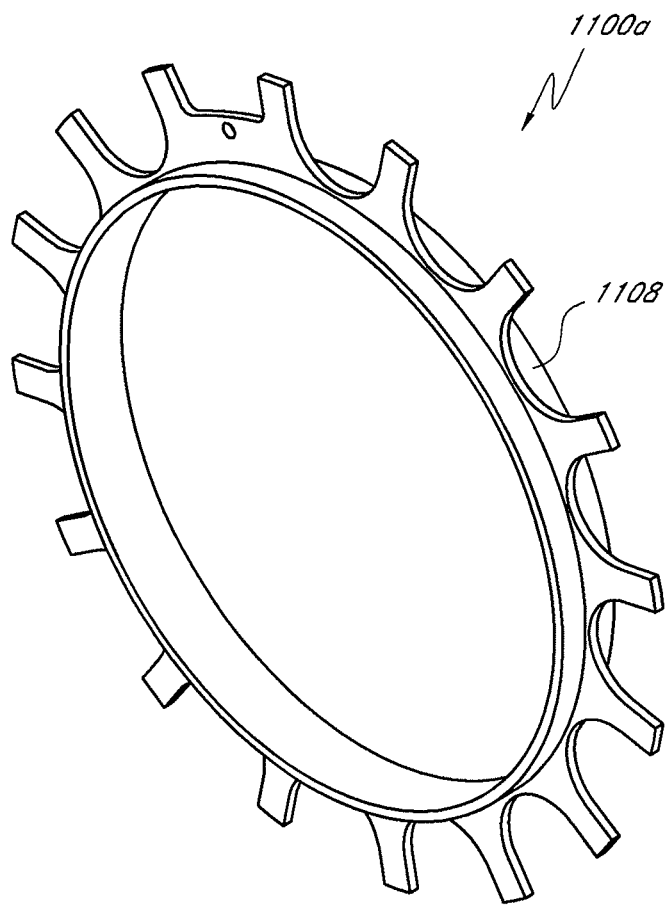
FIG. 11A is a perspective view of a thermoelectric element attachment ring.
Figure 11B:
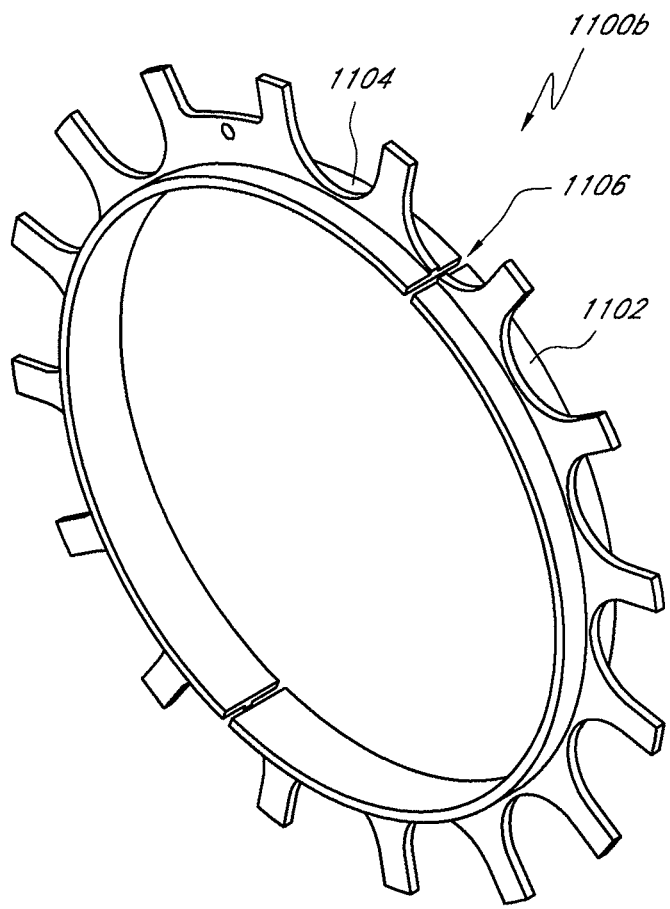
FIG. 11B is a perspective view of a thermoelectric element attachment ring.

Some embodiments include one or more cost reduction and simplification features. Integration of some features, such as high power density TE designs, stack designs, such as the one shown in FIG. 9, TEG architecture, and TEG integration into vehicles are described in terms of the improvements that are used to adapt, modify and use features in the disclosed TEG systems. Simplification features include placing TE elements in a ring configuration 1100a, 1100b, as shown in FIGS. 11A and 11B, rather than singularly and/or in separate modules. The ring 1100 can be constructed from an integral member 1108 or can be constructed from a plurality of ring members 1102, 1104 separated by one or more gaps 1106. The gaps 1106 can be configured to electrically or thermally isolate the ring members 1102, 1104 from one another. Additional simplification features can include integration of one or more flow control valves and combining the TEG with other systems (for example, mufflers or other exhaust system components).

As an example, some conventional TEG designs require that high external forces be applied to maintain contact between components of the TEG system (such as, for example, between TE elements and shunts). In certain embodiments, forces from compliant flexures 228, shown in FIG. 4A, can replace the external loads. As another example, a TE module 230 with a generally cylindrical shape can reduce or eliminate the use of high temperature seals on edges of the system 200 except at the two ends 232, 234. The seal 236 used in the embodiment shown in FIG. 3A, simplifies sealing by using welded or braised seals at high temperatures in combination with thermal management of the seal geometry to allow elastomeric seals at low temperatures. Further, the cylindrical shape of the TEG system 200 and TE attachment features can simplify hot to cold side heat transfer by reducing or eliminating the use of flat heat transfer surfaces over large areas.

Figure 6:
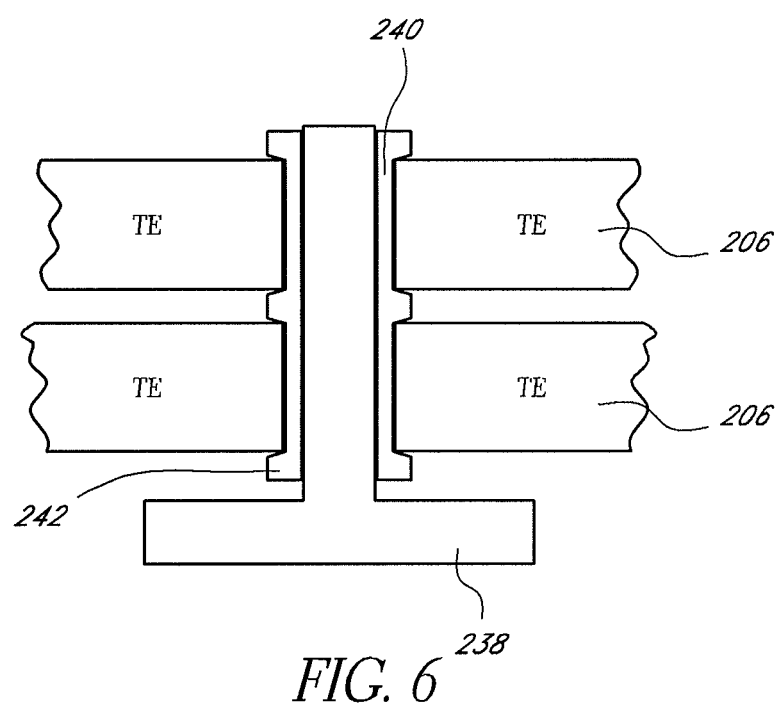
FIG. 6 is a schematic diagram of a thermoelectric element attachment shunt with thermoelectric elements attached thereto.

At least some of the features described herein can increase the efficiency of the TEG system 200. For example, clad heat exchanger surfaces, electrically separated banks of TEs, thermal isolation along the direction of fluid thermal power extraction, and compliant electrical interfaces 240, shown in FIG. 6, at the TE element 206 ends can be used in place of separate TE module substrates. Compliant members 240 can reduce tensile and shear stresses at interfaces between TE elements 206 and a shunt 238. Compliant members 240 can be made from any suitable material, including, for example, screens, sintered metal structures, metal foils, embossed foils, high temperature electrically conductive grease, another material, or a combination of materials. The compliant members 240 can be compression fit, bonded, or attached by locking details in the mating surfaces. The compliant members 240 can include one or more protrusions 242 that assist in positioning TE elements 206. In some embodiments, the interfaces between shunts 238 and TE elements 206 are held in compression by the application of external forces such as through the use of compliant flexures 228, as shown in FIG. 4A.

In some embodiments, the TEG system 200 includes one or more manufacturability and recyclability features. As examples, the TE element groups 204a-c can be mechanically attached, thus permitting them to be replaced or disassembled without de-soldering or de-braising. Further, the TEG system 200 can be generally cylindrically shaped, thereby reducing or eliminating the use of large flat surfaces and the use of complex seals that are in thermal proximity to the cold side. In some embodiments, traditional sealing materials can be used with the TEG system 200.

In some embodiments, the TEG system 200 shown in FIG. 3A meets the objectives stated above in a form factor that can integrate well into vehicle exhaust systems that operate with exhaust temperatures up to 700° C. A cylindrical shape can allow low cost solutions that achieve effective hot side heat transfer, address large thermal expansion mismatches between the hot and cold sides, and reduce sealing complexity. The internal architecture was established from the need to meet durability and stability standards. The design is representative of a family of architectures in which the TEG can be a separate part within the exhaust conveying pipes or is integrated with other components to achieve benefits such as reduced size, reduced weight, reduced cost, increased output, and/or increased efficiency.

In some embodiments, the TEG is part of the exhaust system and can be positioned and designed to replace at least one muffler. Since the TEG extracts thermal power from the exhaust stream and lowers the exhaust stream temperature, flow velocity and back pressure can be reduced. For example, these characteristics are exhibited if the geometry of the exhaust tube is unchanged except for the reduction in gas temperature. Also, since the muffler itself induces back pressure, by eliminating or reducing its functionality, the TEG can have higher resistance to flow which, with proper design, allows a higher heat transfer coefficient. Thus, the extraction of thermal power from the exhaust gas is increased.

In some embodiments, the TEG is combined with a catalytic converter, which can result in one or more benefits. For example, some parts of the catalytic converter can be used in place of at least some of the TEG system 200 components described previously, resulting in a reduced number of parts. As another example, there may be reduced heat loss between the converter and the TEG, resulting in a higher gas temperature at the TEG. A higher exhaust stream temperature can potentially raise the efficiency and/or power output of the TEG system. Further, internal components of the converter can be used to eliminate part duplication. For example, at least part of the housing and seals can share part of the converter's catalyst holder structure. The TEG system can also provide integrated functionality to speed converter warm up by providing thermal feedback and/or electrical power to heat the converter more quickly. By adding the TEG system to the catalytic converter, internal and external bracketry and other attachment features can be reduced. Also, integration with the converter allows a portion of the TEG to be positioned between the engine and the converter. Such a position can increase the operating temperature of a portion of the TEG, reduce the time it takes for the TEG to reach an operating temperature, and/or permit the temperature of the catalytic converter to be controlled by at least a portion of the TEG.

An exhaust gas recovery system (EGR) can also be integrated with the TEG with a similar savings in complexity of the individual parts. Since the ERG uses engine coolant to cool a portion of the exhaust gas, the same cooling system can be adapted to remove waste heat from the cold side of the TE elements. With the EGR, the exhaust gas valve can also be combined in proximity to the TEG valve to simplify system design. The EGR adds back pressure to the exhaust system so the combination can reduce some degree of duplication and thereby reduce back pressure losses and/or increase heat transfer.

In some embodiments, a TEG system uses existing vehicle materials and design principles that have proven successful in recent exhaust system products.

FIG. 3A shows a sectional view of a TEG 200. The innermost chamber 218 is an exhaust bypass that accommodates the highest operating exhaust mass flow rate while maintaining back pressures within the design limits of an attached engine (not shown). A butterfly valve 224, shown in FIG. 3A, or other advantageous exhaust gas flow director, is positioned at the cold end 234 of the TEG 200 to adjust exhaust gas flow between the bypass 218 and hot side heat exchange core 216. An inner sleeve 222 may line the inside surface of the heat exchanger 214 to separate the gas flow between the heat exchanger 214 and the innermost chamber 218. The valve 224 apportions flow so as to keep backpressure within design limits while optimizing heat extraction from the exhaust stream under the operating range of exhaust temperatures and mass flow rates.

In the embodiment shown in FIG. 5, heat exchange structures 220, such as, for example, fins, are positioned within the bypass area, and in good thermal contact with the sleeve 222, the hot side heat exchange core 216 and the hot side shell 210. Such features can enhance thermal power extraction at low back pressure when the bypass valve 224 is partially or completely in a position to allow exhaust gas flow in the inner core 218. The heat exchanger structures 220 can be constructed of a copper core clad with AISI 316 stainless steel (DIN 1.4401) on both faces. Any other material or material combination such as Stainless clad nickel or carbon, ceramic composites that meet the TEG design criteria can also be used. Advantageously, the heat exchange structures 220 are braised to the inner surface of the hot side TEG shell 210, but can be attached by any method that provides good heat transfer. The shell 210 can be constructed of 316 stainless steel, another suitable material, or a combination of materials.

In certain embodiments, the material system of the TEG 200 is configured to provide a favorable compromise between the chemical protection and strength of the stainless steel (for durability and longevity) and the high thermal conductivity of copper (for efficient heat conduction and transfer). Alternately, the heat exchanger and/or shell and/or inner sleeve may be constructed of other materials, such as high thermal conductivity ceramics, silicon nitride, silicon carbide, alumina, another effective heat exchange material, or a combination of materials. The heat exchangers 214, 220 can also be integral with the shell 210. For example, in some embodiments, the heat exchangers 214, 220 are cast or extruded from ceramics or metals. Other methods of achieving the same objective of heat transfer are possible, such as making the hot side shell 210 convoluted or textured to increase its surface area and heat transfer coefficient, incorporate multiple (bundled) tubes to form the outer shell, or employ any other method of enhancing heat transfer from the exhaust gas through the shell.

An example method of making the TEG 200 will be described. The outer surface of the shell 210 can be treated with a high thermal conductivity, electrically insulating coating that is stable over the entire fabrication and operating temperature range. For example, the shell may be coated with K-Tech 28 proprietary coating, plasma sprayed alumina, aluminum nitride, or any other durable coating that meets the design intent. As an alternative to a coating, the shell 210 may not be coated, for example, if electrical isolation is achieved in the electrode structures, as noted below (see FIG. 12). Thermally conducting shunts 1100a, 1100b, as shown in FIGS. 11A and 11B, can be attached to the shell. The shunts 1100a, 1100b form the hot side thermal and electrical connections to the TE elements 206. The hot side shell 210 surface can be coated with a metallic material system which bonds the shell to the shunts to achieve both mechanical stability and high thermal conductivity. For example, the shell 210 (with K-Tech coating) can be metalized with titanium about 0.3 microns thick, plated with low phosphorus electrodeless nickel about 2 microns thick and Tin 15 microns think. Any other suitable bond materials and material thicknesses or combination thereof may be used, as well. Copper alloy shunts 244 can then be put in good thermal contact with the shell by reactive bonding the Tin to the Copper at 500° C. The shunts 244 can be formed into rings that surround the shell. The rings are heated to about 250° C. to expand them, and, while hot, slipped over the cold shell and positioned in the design location. The rings cool and shrink to form a compression fit. A subsequent heat soak at 500° C. bonds the rings in position.

Figure 12:
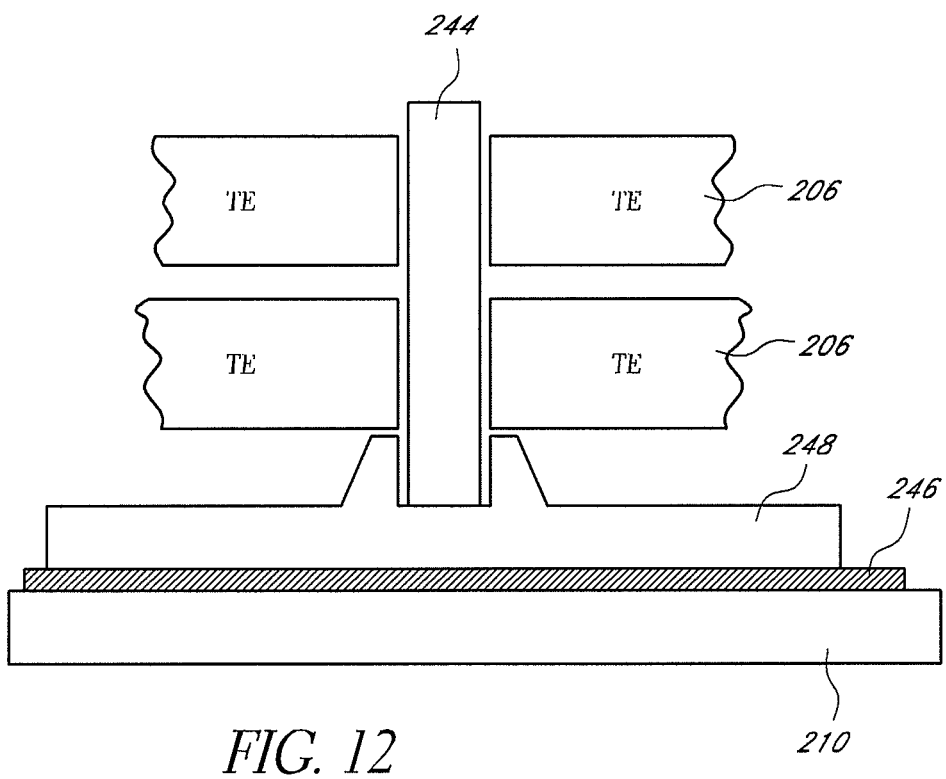
FIG. 12 is a schematic diagram of a thermoelectric element attachment shunt connected to a shell of an exhaust pipe.
Figure 13:
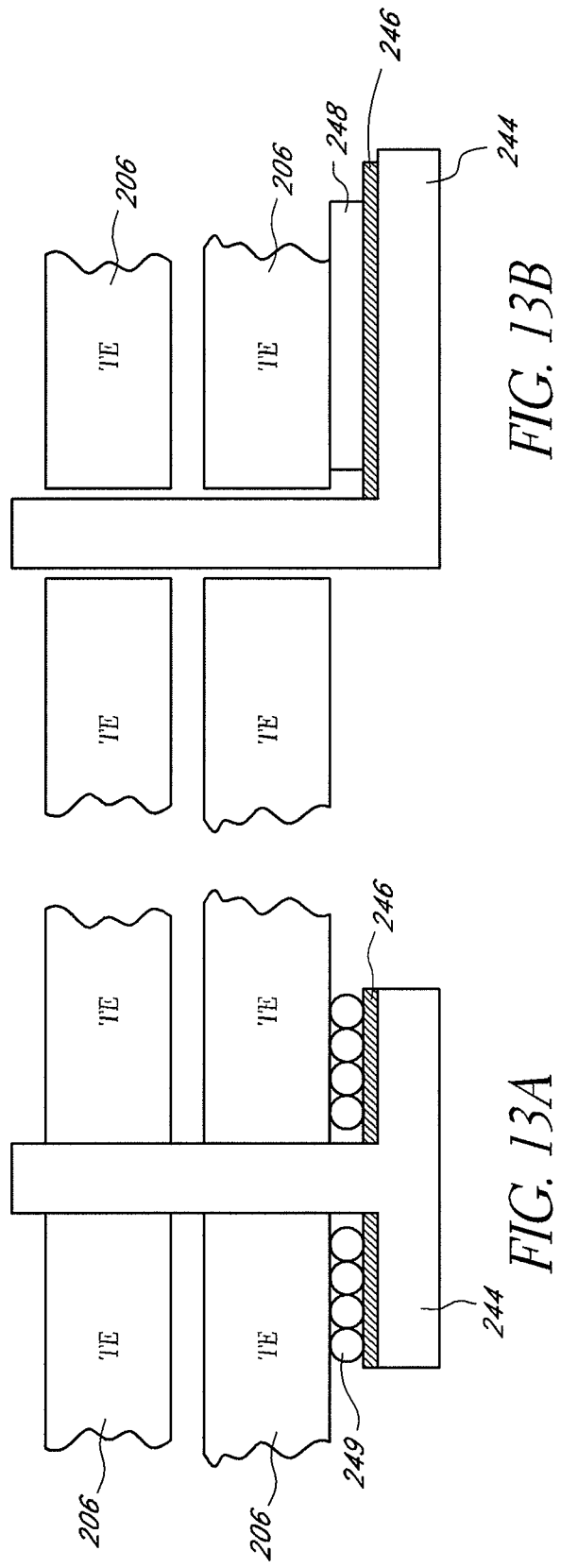
FIGS. 13A-B are schematic diagrams of thermoelectric element attachment shunts with positioning structures disposed thereon.

Other techniques can be employed to thermally and mechanically attach the shunts 244 to the shell 210 structure. For example, high temperature glasses, ceramic adhesives, mechanical locking (using slots, pins or the like), braising, welding or any other method may be used. If the shunts 244 are not electrically isolated from the shell, the shunts 244 can incorporate electrical isolation within their structure, as shown FIG. 12. For example, the shunts may be coated with K-Tech 28 coating, available from Bodycote K-Tech, Inc. of Hot Springs, Ark. Further, the shunts may be a laminated or be of any other material system that provides electrical isolation and good thermal conduction to TE elements. The shunts 244 may be held in position with one or more bands 248 made of stainless steel or another material, as shown in FIGS. 12 and 13A-13B, and the bands 248 may be electrically isolated from the shunts 244 with a high temperature electrical insulator 246, such as glass cloth, mica or any other suitable insulation.

The shunts 244, formed into a ring 1100a, can have many TE elements 206 in parallel, as shown in FIG. 11A. Alternately, the shunts may be sections (arcs) 1102, 1104 of a circle, so that one or more TE elements 206 are in parallel, and several arcs can be in separate electrical paths, as shown in FIG. 11B. For example, several arcs 1102, 1104 can be in electrical series to increase output voltage of the device. Groups of shunts 244 may be connected in series/parallel arrangements to achieve a suitable balance of reliability and operating voltage. The shunts can have provisions to attach multiple TE elements 206 in groups to achieve TE element stability, longevity, reliability and match the thermal power density of the hot and cold side heat exchangers.

A computer model can be used to optimize a design for the intended range of operating conditions. The model can simultaneously maximize conversion efficiency and minimize weight. In an advantageous design, the elements 206 are clustered into 16 groups of four around the circumference of each ring 1100. At the high temperature end 204a, the TE elements are segmented and about 5 mm long. At the opposite end 204c, they are about 2 mm long (for example, less than or equal to about half the length of the TE elements at the high temperature end 204a). The TE elements 206 can be segmented and can be constructed from suitably doped lead telluride for portions operating between about 250° C. and 600° C. and doped with bismuth telluride for portions operating up to about 250° C.

Figure 10:
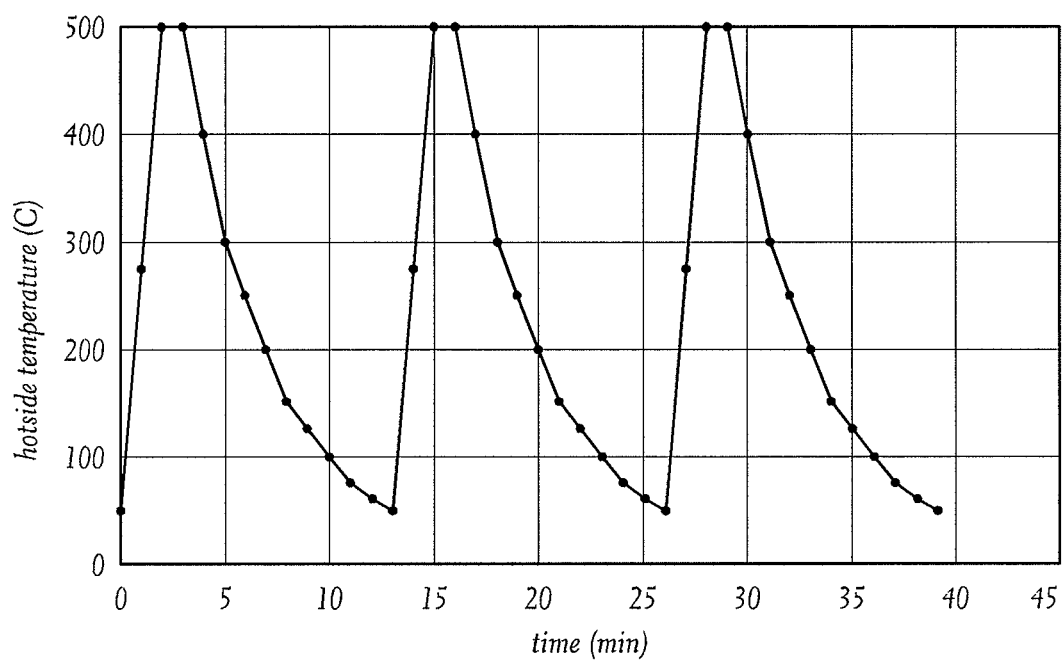
FIG. 10 is a chart showing a relationship between the temperature at a hot side of a thermoelectric element and time.

The lengths 226a-c of the TE elements 206 can be chosen to maximize electric power production from each element 206, while maintaining stresses below limits. The TEG 200 is configured to provide low interfacial electrical and thermal resistance at both the hot and cold ends, while maintaining acceptably low shear and normal stresses throughout the TE elements, as shown in FIGS. 8A, 8B and 8C. Thermal cycling studies were conducted to verify stable operation for the target cycle life for the prototype system. Results of thermal cycling tests indicated that 2 stage segmented TE elements (p: 2.4 mm×3.75 mm×4.4 mm, n: 2.4 mm×3.75 mm×4.8 mm) provided consistent power production over at least approximately 300 thermal cycles. A profile of three exemplary thermal cycles employed during the studies is shown in. FIG. 10. TE element weight and, hence, power density are approximately inversely proportional to the square of element length in the direction of current flow. Cost is generally proportional to TE material weight. In some embodiments, the minimum length for the TE elements is established for each maximum temperature differential along the TEG length, in combination with balancing heat from the exhaust stream and heat rejection from the cold side.

Figure 14:
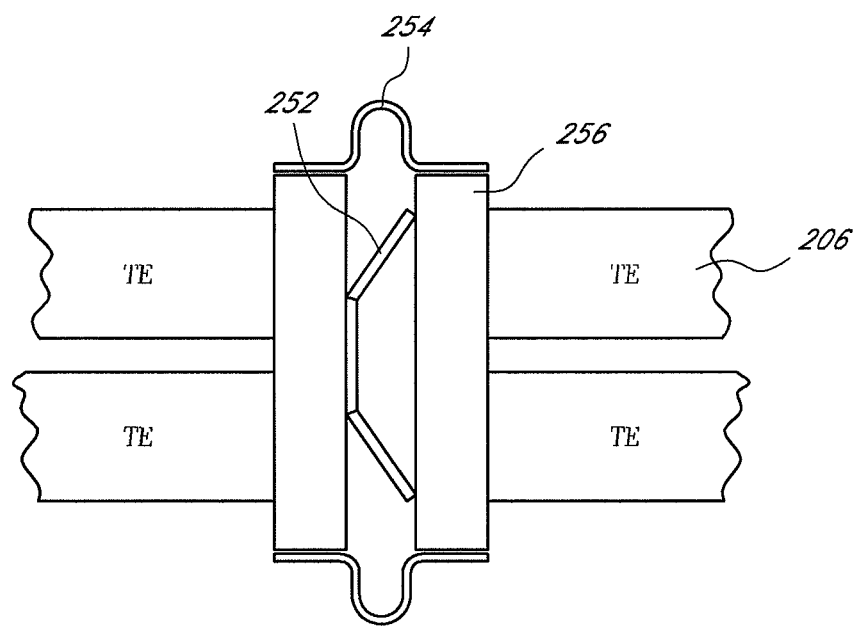
FIG. 14 is a schematic diagram of a shunt electrical joint on a cold side of a thermoelectric element.

In certain embodiments, the cold side shunt 256 and heat exchangers 208 are designed to transport electric power efficiently generally in the axial direction and remove thermal power circumferentially from the cold side of the TE elements 206 and to a cold side heat sink 250. Both transport mechanisms can accommodate thermal expansion mismatches between the hot and cold sides and to increase design reliability and reduce design complexity. The cold side shunt 256 electrical joint, shown in FIG. 14, can include flexible copper leaves 252 to transmit electrical power and Belleville washers 254 to apply uniform compressive loads to the TE elements 206 throughout operating temperature range. Any other flexural joining system may be used. For example, high conductivity electrically conductive grease could be used for electrical connection and a coil spring or elastomer for maintaining compressive force on the TE elements 206. Alternately, the compressive member 254 could be highly electrically conductive and provide both electrical connection and compressive force, such as a bellows, wavy washer or leaf spring.

Figure 22:
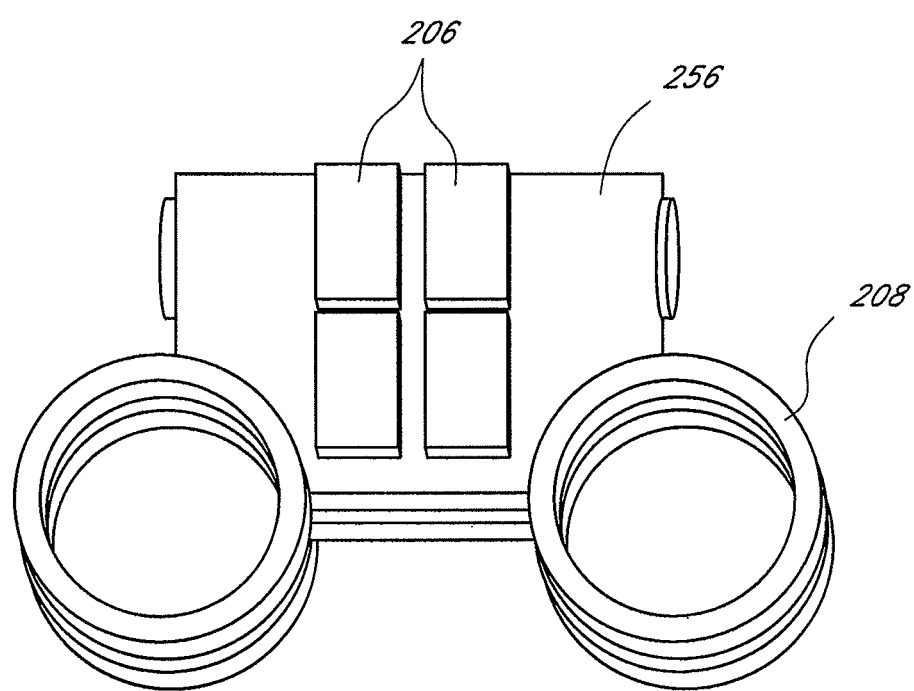
FIG. 22 is a perspective view of the cold side heat exchanger shown in FIGS. 4A and 4B.

In certain embodiments, flexible joint heat exchangers transfer thermal power from the cold side shunt 256 to the heat sink fluid 258. For example, tubes 250 can be used to thermally connect with the cold side shunts 256 and transfer thermal power. The tube-in-tube configuration shown in FIG. 4B has the quality that no external force need be applied to achieve good heat transfer, since the inside diameter of the outer tube and outside diameter of the inside tube control the gap between the two parts. Such dimensions in tubes can be held tightly and at low cost. Cold side tubes 250 can have expansion joints to accommodate dimensional changes due to thermal expansion between the hot shell and the cold side heat sink. In some embodiments, the tubes 250 are electrically isolated but in very good thermal contact with the cold side shunts 256. For example, thermal grease can be used to allow relative motion and good thermal conductance between the shunts 256 and the coolant tube 250. Aluminum wire or any other suitable form of heat transfer enhancement can be used to increase heat transport from the cold side shunt 256 to the cold side fluid 258. Manifolds 260 or any other suitable fluid distribution system can distribute and/or collect coolant to the cold side tubes. The cold side working fluid can be water, an ethylene glycol/water mixture similar to radiator fluid, or any other suitable fluid. FIG. 22 is a perspective view of the cold side heat exchanger shown in FIGS. 4A and 4B.

The assembly can be contained within an outer shell 262 that protects and seals the active components from the environment. The shell 262 is maintained close to the coolant fluid temperature by exposure to ambient conditions outside and the proximity of the coolant 258 on the inside. Thermal expansion mismatch between the hot side tube 210 and the shell 262 can be absorbed by transition members 264 at both ends 232, 234. The end members 264 are constructed of low thermal conductivity stainless steel to reduce heat transfer between the hot tube and the outer shell. Flexible sealant can absorb any remaining thermal expansion mismatches.

Thermoelectric subassemblies have been tested to determine durability and performance in comparison to models. Test results were compared to a model that uses intrinsic material properties as inputs, except one parameter, the TE element 206 interfacial resistance, which is fitted to the experimental data. The fit, over a broad range of currents and temperatures, suggests that this single parameter, accounts for most of the observed performance variations. The model is generally suitable for describing the performance of the device.

The TE elements 206 can function as variable thermal solid state resistance components that interact with the exhaust stream 202 and the coolant fluid 258. By adjusting the current flow through the TE elements 206, the thermal impedance of the TE assemblies change. For example, if no current flows, the impedance is relatively high so that less thermal power can be extracted from the exhaust fluid stream 202 and into the coolant 258. If the TE elements 206 are shorted so that current is limited by the internal resistance of the TE elements 206 rather than an appreciable external resistance, then the thermal conductance of the TE elements 206 can increase by about 70%, if the TE material has a ZT of about 1. Controlled variation in thermal resistance can be used to modify the extraction of thermal power so as to cool the exhaust flow 202 by a certain amount. This control over exhaust temperature can be used in combination with the function of an EGR system to tailor the recirculating exhaust to improve overall system performance of the EGR. Exhaust temperature control can also be used to improve the operation of a diesel particulate filter or of a waste heat recovery device for engine preheating or for vehicle occupant comfort (e.g., a heat exchanger that connects the exhaust system to powertrain fluid). The range of thermal conductance variation can be increased by applying external voltages of positive and negative polarity. By doing so, it is possible to achieve conductance ratios of at least 2.5 to 1.

While the above description is presented, by way of example, in the context of recovering energy from a vehicle exhaust flow, the embodiments described herein could be used in other types of thermal power recovery systems. For example, they could be used in combination with an industrial auxiliary generator or with an industrial flow process, such as would be associated with cement processing, aluminum extraction, iron smelting, or any condition where there is a material that presents itself and its thermal content is otherwise wasted. Under some circumstances, the embodiments can also be used to produce primary power in certain application such as for remote power production to transmit signals, to charge batteries, and with improved efficiency thermoelectrics. It could possibly be used for auxiliary power units for aircraft, vehicles to power electric devices when their primary engine is off, or in buses to power the HVAC. With high enough efficiency thermoelectrics, a waste heat recovery generator could replace the primary engine of a vehicle in at least some circumstances.

To effectively make power from a heat source with TE devices, as much heat from the heat source as possible must be extracted and the temperature drop across the TE elements should be maximized and the electrical resistance in the electrical circuit within the generator should be minimized. Further, over the temperature range of operation, the resulting system should be configured or controlled to optimize electric power output. These objectives are achieved by matching the temperature gradient and thermal impedance of the heat source and sink with the TE material(s) and configuration(s), managing all of the interfaces, efficiently getting heat and electricity into and out of the TE materials, providing electrical and thermal insulation where it is beneficial and/or vital and handling the material related issues associated with high temperature operating conditions, such as thermal expansion mismatch, stability at high temperatures and degradation from the presence of corrosive fluids at the operating temperatures, such as by oxidation, poisoning with CO, $CO_2$, $N_2$ or the like.

Disclosed are designs for (1) effectively extracting thermal power from a high temperature heat source that has sufficient thermal conductivity and excellent heat transfer surface area, (2) handling high temperatures (>1000° C.) and handling the thermal shock associated with such high temperature applications, (3) solving the fundamental problem of providing electrical isolation at high temperatures (>400° C.) while maintaining high thermal conductance, (4) preventing any degradation or other issues associated with thermal expansion mismatches of high temperature coatings with metallic surfaces, (5) integrating the thermoelectric generator (TEG) into a catalytic converter or catalytic combustor housing, (6) controlling the temperature of portions of the system by use of the variable thermal transport properties of TE devices, (7) providing added function such as exhaust gas recovery (EGR) and (8) providing suitable design and performance characteristics to mate well with other power conversion systems (e.g., co-generators, heating systems, temperature control systems, combustion systems and the like). Various embodiments described herein provide one or more of these advantages.

In certain embodiments, TE material(s) are integrated with heat exchanger structures such as metallic or ceramic honeycombs, cylinders, catalytic surfaces, plates, rods, tubes or the like. The heat exchange materials are in good thermal communication or thermal contact with metallic rings, ceramic shapes or any other high electrical conductivity structure that connects TE devices, TE elements or other TE components thermally to the sources of heat and physically isolates these TE parts from the heat sources and heat exchanger surfaces. If the connecting surfaces to the heat exchangers are electrically conductive (e.g., impure SiC, a metal, an electrically conductive liquid or the like), a coating or coatings can be employed that provide good thermal connectivity and good electrical isolation over the range of operating conditions. In certain embodiments, the TEG is integrated within a system to achieve multiple functions, such as integration with a catalytic converter, a combustor, a co-generator heat source or the like, and that the presence of the TEG provide synergistic benefit. That is, the combination in certain embodiments provides one or more of the following: reduced weight, reduced cost, reduced volume, increased efficiency, added functionality (e.g., controls temperature, adds EGR functionality to a catalytic converter) or the like.

One advantageous embodiment integrates the TEG directly into a primary power generator, rather than to have a design with separate combustor and TEG subassemblies. In this embodiment, a combustor is inserted inside a ceramic honeycomb, and the combustor is integrated into the heat exchanger so that both the combustor and the TEG are connected intimately with the heat exchanger. In doing so, a portion of the thermal losses from the combustor (e.g., radiation, conduction and convection) are directed to the heat exchanger and are thus not completely lost to the system. Further, integration of the combustor in the heat exchanger can minimize weight, complexity, size and cost. Also, the integration of the TEG and/or combustor reduces startup time since ducting and other components are minimized or eliminated compared to a non-integrated TEG and/or combustor. Ducting and other components can slow warm up or light off (e.g., time for the temperature of heat exchange to increase to operating temperature, such as the temperature for a catalytic converter to reduce emissions). Finally, a catalytic burner can be directly integrated into the design so that the combustion surface(s) transfer heat to the TE elements through a thermally conductive and electrically insulative interface(s), and reducing or eliminating conduits, separate heat exchangers, TE modules and the like.

Figure 15A:
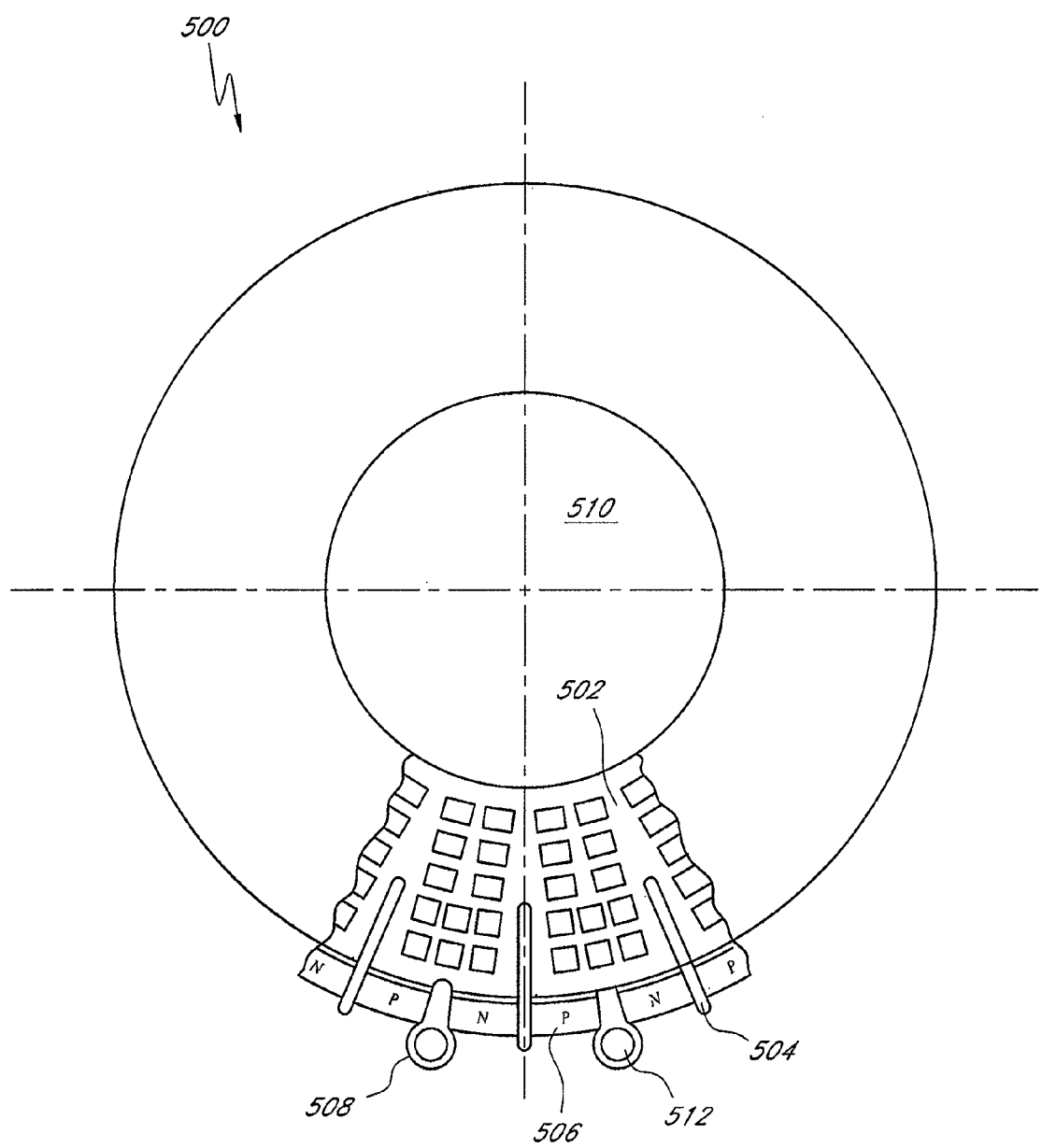
FIG. 15A is an end view of an example catalytic converter illustrating a section of the heat exchanger and TEG structures in accordance with certain embodiments described herein.
Figure 15B:
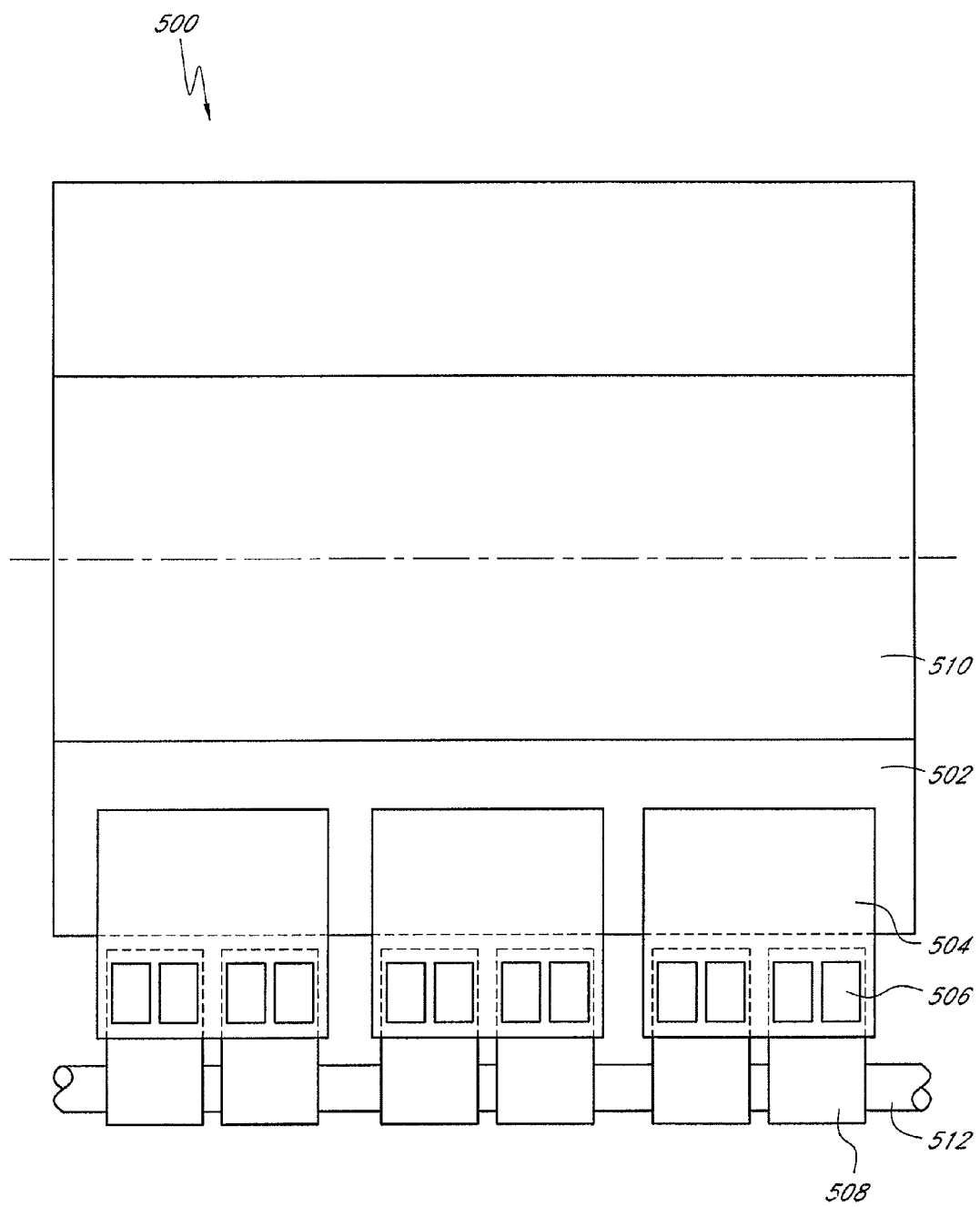
FIG. 15B is a side view of the catalytic converter of FIG. 17A.

In another embodiment, the TEG is provided in combination with exhaust train components (one or more catalytic converters, particulate traps, mufflers or the like) of a vehicle exhaust system. While other patents have previously discussed recovering waste heat from catalytic converters using TE devices, they teach attaching TE modules to the outside of the catalytic converter shell rather than integrating the TE material more intimately to the catalyst carrier (e.g., the ceramic honeycomb) so as to save additional weight, size, cost, or increase efficiency and the like. In some embodiments, the more intimate integration includes providing added functionality and the attendant benefits, as is described more fully below. An advantageous embodiment includes TEG integration with ceramic honeycombs that are used as a substrate for a catalyst within many automotive catalytic converters. Advantageously, the ceramic honeycomb can be modified to gather and transport heat to specific locations to which TE elements and connecting electrical circuitry are attached, such as is shown in FIGS. 15A and 15B. The ceramic honeycomb functions as a heat exchanger, catalyst holder, electrical isolator and framework (structural element) for the TEG. With the integration of shunt members (see FIGS. 15A and 15B), the basic thermal and electrical circuitry of the TEG are fabricated into the ceramic component.

FIG. 15A depicts a partial schematic of a portion of an example catalytic converter 500 in accordance with certain embodiments described herein. In an advantageous embodiment, the converter contains a ceramic honeycomb structure 502 with catalysts on a portion of the ceramic. The design of the honeycomb 502 has been advantageously modified to incorporate one or more hot side shunts 504 which are in good thermal contact with the ceramic honeycomb 502. Further, the honeycomb shape has been modified to increase thermal power extraction from the exhaust gas to the one or more hot side shunts 504. The increase in thermal conduction can entail increasing the thermal conductivity of the ceramic by modifying the ceramic material properties (such as by changing material, thickening it, increasing its density, adding high thermal conductivity constituents, designing the shape to optimize thermal conduction to the shunts 504, changing the shape of the shunts 504 to provide better conduction, changing the shape of the honeycomb 502 itself or/and any other method that improves heat transport to the TE elements 506). If for any reason the honeycomb 502 is too electrically conductive to function as electrical insulation for the TEG system 500, the one or more shunts 504 can be formed into two or more sections with at least one portion providing electrical insulation, the one or more shunts can be coated with electrical insulation where it attaches to the ceramic, the ceramic can have at least one insert of other material(s) to insulate the shunts, or any other method can be employed to isolate the one or more shunts 504 from the ceramic honeycomb 502.

It may be advantageous to have at least one alternate flow path (e.g., bypass 510) through the honeycomb 502 such that some or all of the flow goes through the bypass instead of the honeycomb structure of the honeycomb 502. For example, the bypass 510 can be used to perform one or more of the following: to reduce pressure drop at high exhaust gas flow rates, to adjust temperatures in the system, to operate at startup, very cold conditions or at some other advantageous conditions. The alternate flow path (e.g., bypass 510) can be open as shown in FIG. 15A, or it can contain ceramic material and catalyst with different properties that enhance performance under specific conditions. Further examples of alternate flow paths and bypass configurations are discussed with reference to other TEG system embodiments disclosed herein.

Figure 16:
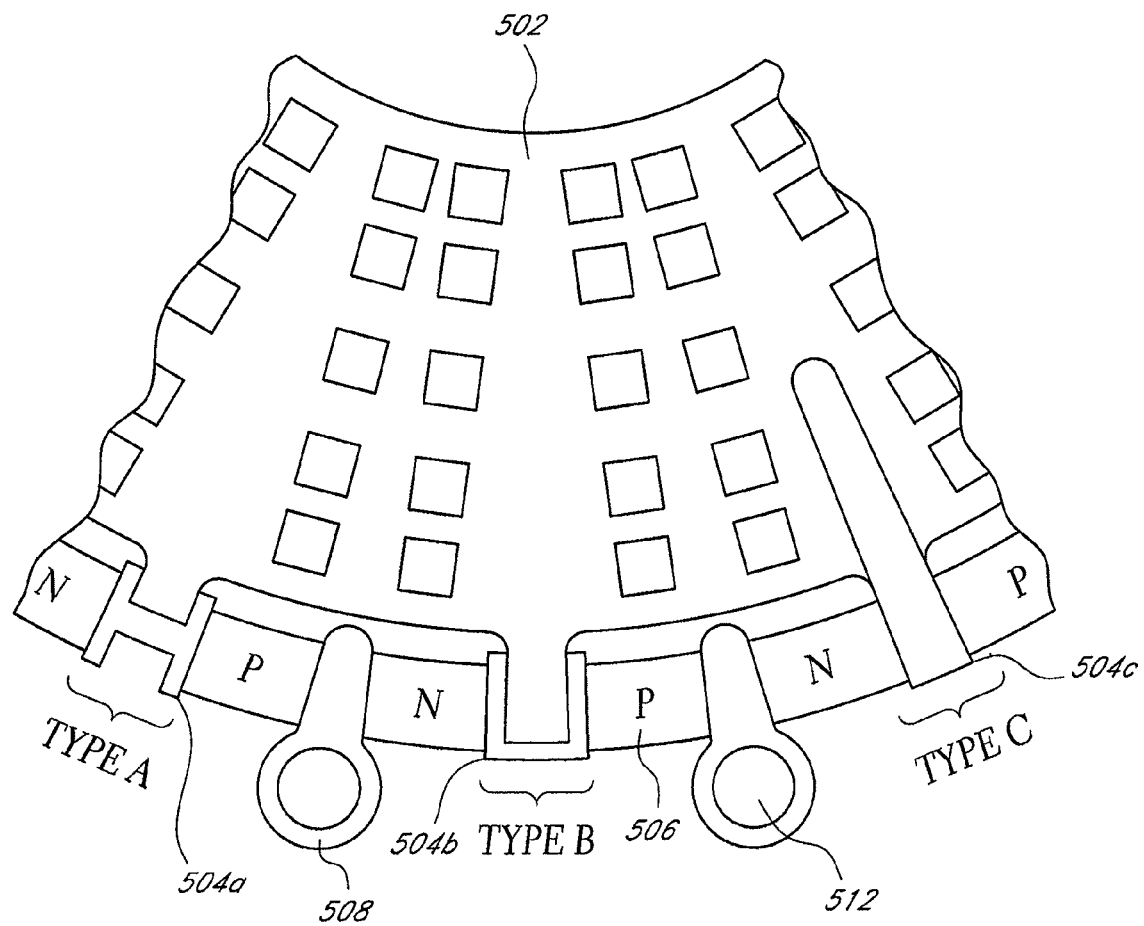
FIG. 16 is a partial end view of an example heat exchanger and TEG structure illustrating various shunt configurations in accordance with certain embodiments described herein.

Advantageously, the shunts 504 can be a simple shape and easily manufactured from a material (e.g., metal) with high thermal and electrical conductivity, such as stainless steel clad copper, molybdenum clad copper, copper containing pyrolytic graphite or any other suitable material system. Good thermal contact between the materials (e.g., shunts 504) and the honeycomb 502 throughout the operating life of the device is important, so it is advantageous to match the shunt's (e.g., metal) coefficient of thermal expansion (CTE) with the honeycomb's (e.g., ceramic) CTE. The shunts 504 can be more complex, as depicted in FIG. 16. For example, the shunts 504 can be heat pipes, composites, coated pyrolytic graphite, boron nitride, or any other useful material system and shape. Alternately, the shunts 504 can be made from a ceramic with a CTE that is compatible with the honeycomb's material. For example, the shunt can be made from ceramic such as MN. Further, the shunt 504 can be metallic, cermet (composite material composed of ceramic and metallic materials), or other high thermal conductivity material. The shunt 504 can be configured such as one or more of Types A, B, or C in FIG. 16 and can include an insert or other feature (e.g., a rivet, eyelet, clip, or the like). As shown in FIG. 16, the shunts 504 can provide electrical connections between TE elements 506.

Figure 17:
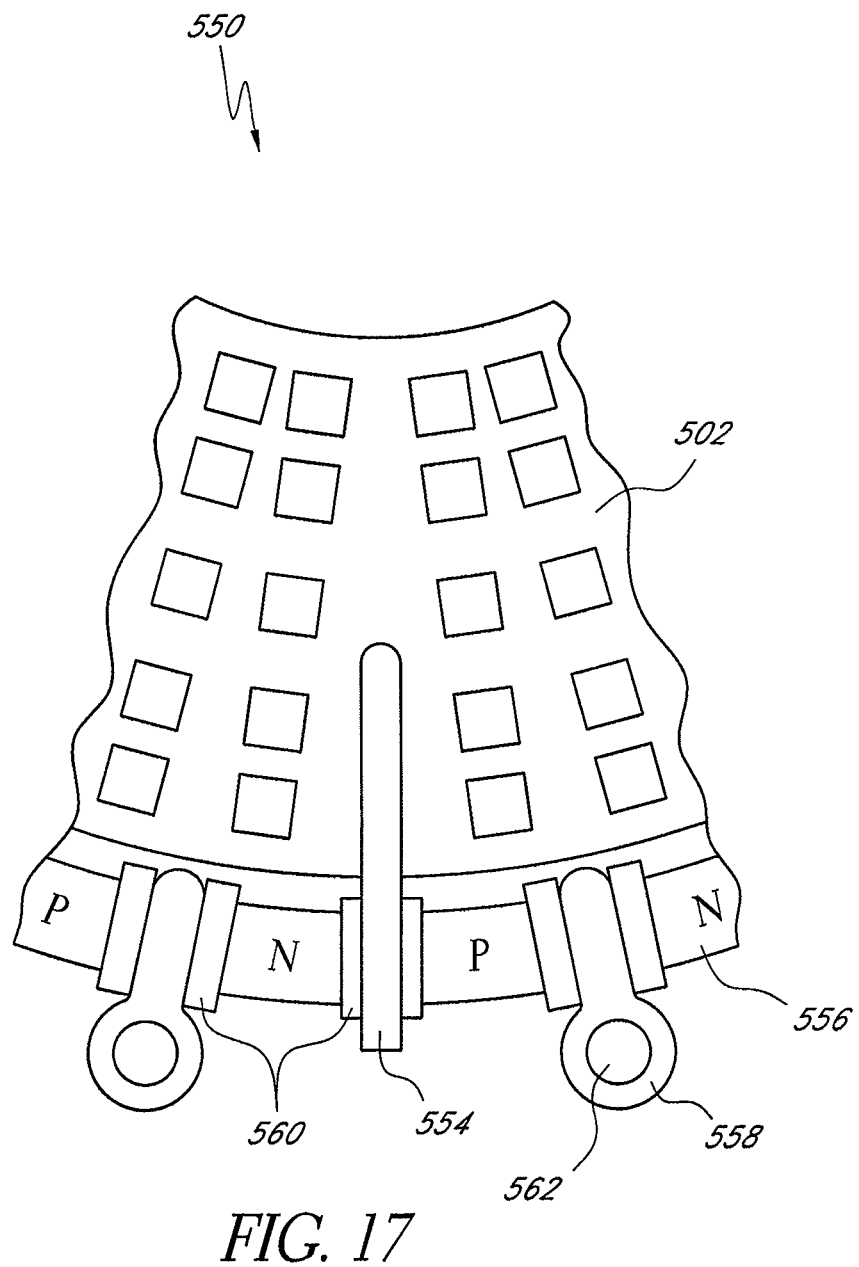
FIG. 17 is a partial end view of an example heat exchanger and TEG structure illustrating various configurations of cold side assemblies and hot side assemblies in accordance with certain embodiments described herein.

The TE elements depicted in FIG. 16 are in a stack configuration with a series-parallel electrical connection of multiple elements. Alternately, the TE elements can be configured in the traditional design, again either in series or series-parallel arrangements, as depicted in FIG. 17. For example, the cold side shunt 508 and the hot side shunt 504 illustrated in FIG. 16 are in electrical communication and thermal communication with the TE elements 506, and the cold side assembly 558 and the hot side assembly 554 illustrated in FIG. 17 are in thermal communication but not in electrical communication. Furthermore, not shown in FIG. 17, the hot side shunts 554 and cold side shunts 558 can be in electrical communication. Examples of configurations of electrical connections between TE elements that can be used are discussed in U.S. Pat. No. 6,959,555, the entirety of which is hereby incorporated by reference and made a part of this specification. The hot side assembly 554 can include a thermal transport material, such as those described as the hot side shunt materials with reference to FIGS. 15A-B and 16.

In certain embodiments, electrical insulation 560 is added between the shunts 554, 558 and the hot side assembly and/or cold side assembly, as shown in FIG. 17. Advantageously, the electrical insulation 560 has high thermal conductivity and high electrical resistivity. Shunts are placed in good thermal contact with the hot side assembly and have TE elements 556 connected in a standard configuration in the general direction of exhaust gas flow. The hot side assembly can be electrically isolated from other hot side assemblies. Similarly, the cold side assembly can be electrically isolated from other cold side assemblies and be in good thermal contact with the cooling fluid 562 and the cold side shunts 558. In certain embodiments, the electrical insulation electrically isolates the cold side assembly and/or the hot side assembly, but the shunts 554, 558 on the cold and hot side are in electrical communication.

Figure 18:
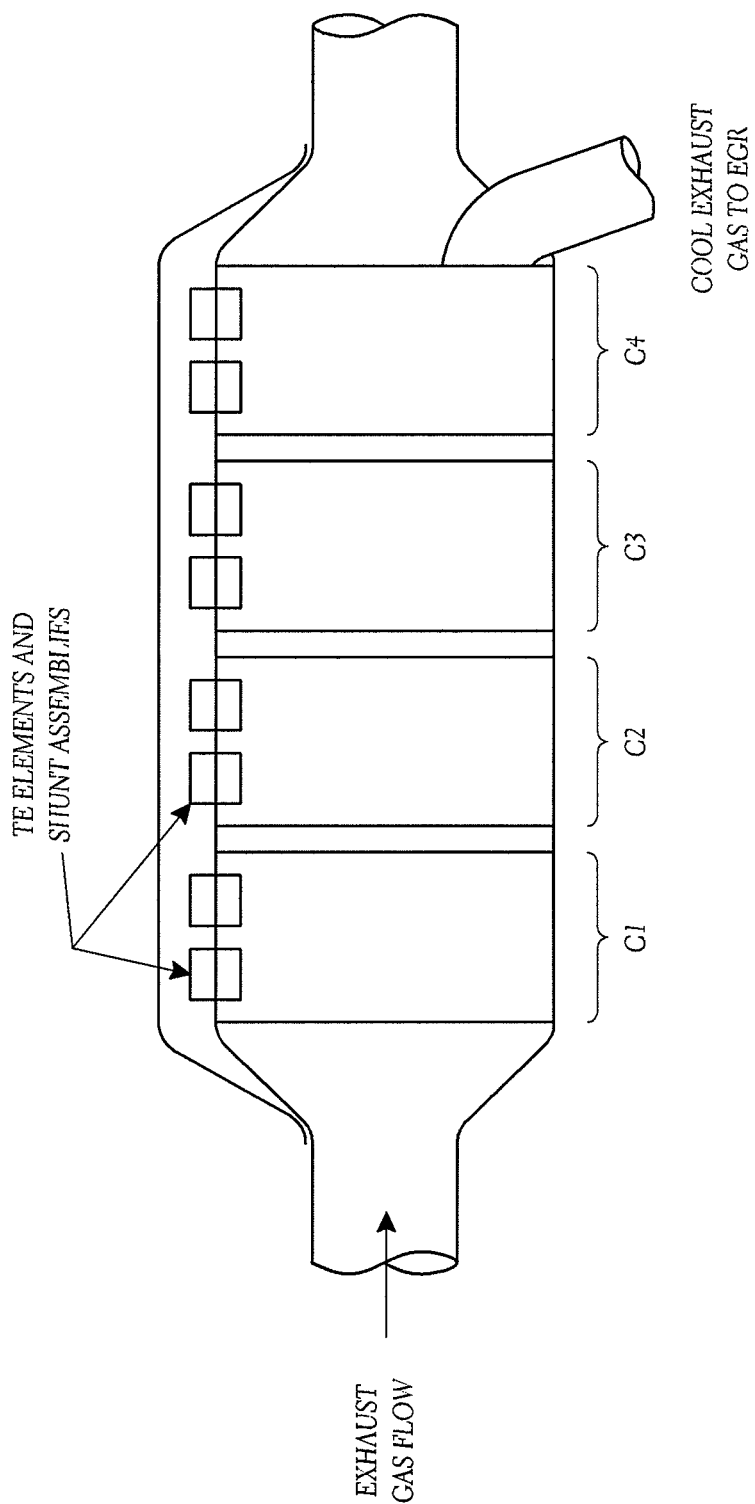
FIG. 18 is a side view of an example catalytic converter with four TEG segments in accordance with certain embodiments described herein.

FIG. 18 depicts an advantageous arrangement for an example catalytic converter that utilizes multiple honeycomb structures within the same package in accordance with certain embodiments described herein. In FIG. 18, C1 is a conventional structure, modified to incorporate TEG components. A primary function of C1 is to function as the catalytic converter. This may modify or reduce the amount of thermal power that can be extracted by the TEG under certain operating conditions. A second TEG segment, C2, is incorporated to extract additional thermal power, thus increasing electrical power output and further cooling the exhaust gas. If the exhaust gas is effectively conditioned by passage through C2, it can be adjusted to a suitable condition (e.g., temperature) to pass through a second catalyst, C3, for further treatment. C3 is shown to include TEG components, but C3 may or may not, depending on the operating conditions of the system. C4 is shown as a final stage of the TEG to further extract thermal power from the exhaust stream. C4 may or may not contain a catalyst. FIG. 18 illustrates an example configuration of TEG segments in accordance with certain embodiments described herein, but in certain embodiments, more or fewer TEG segments can be included. Furthermore, the TEG segments described above can be placed in a variety of configurations. For example, the order and type of TEG segments included in the structure can be selected depending on the application. A portion of the exhaust gas, if it is cooled sufficiently, may be used to perform the exhaust gas recovery (EGR) function that is part of many vehicle emission control systems.

Figure 19:
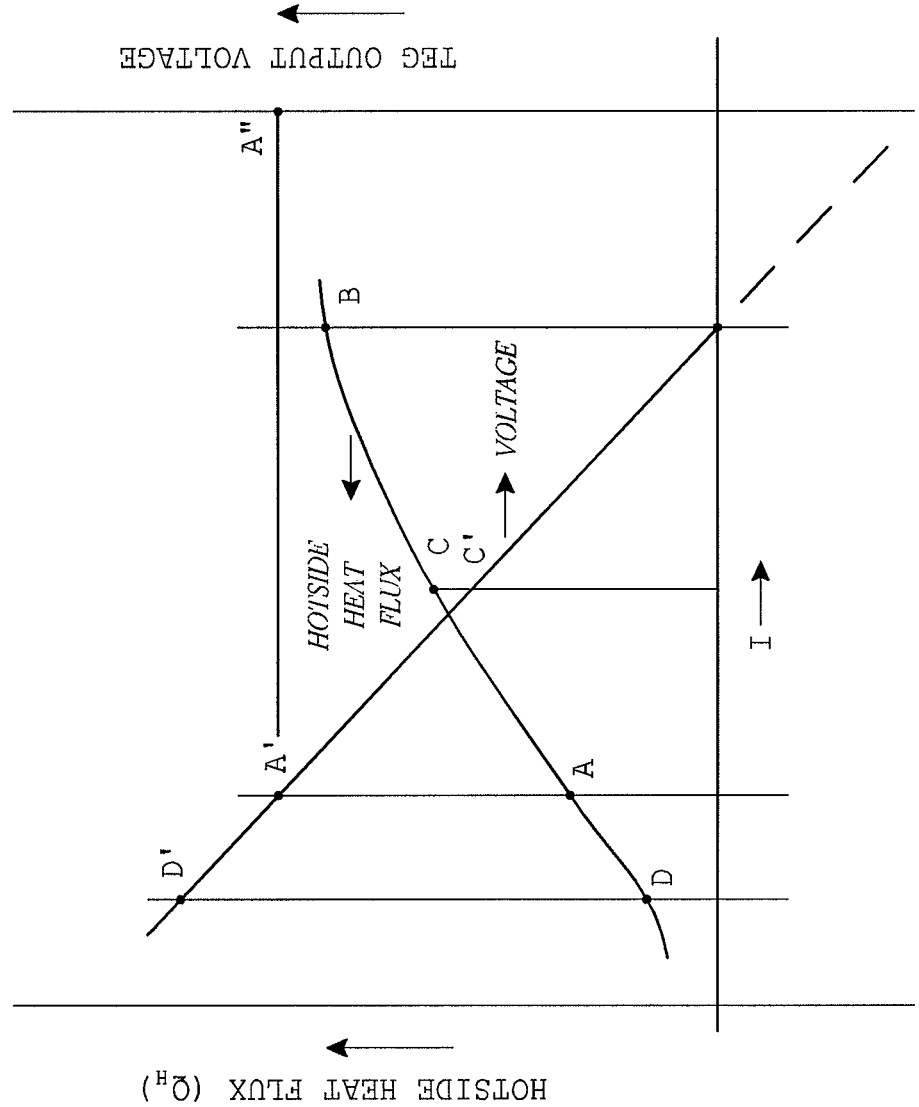
FIG. 19 is a plot of the thermal power absorbed by a hot side of a TEG portion and the voltage across the TEG portion as a function of current flow.

FIG. 19 depicts a further feature included in some embodiments. Relationships between parameters illustrated in FIG. 19 can be utilized and integrated into TEGs by use of a suitable control algorithm (e.g., hardware or software of a computer system) and hardware controls to improve performance. The horizontal axis is the current flowing through a portion of a TEG that is to be controlled, as described below. The vertical axis to the left is the thermal power absorbed by the hot side of the TEG portion. The vertical axis on the right is the voltage across the portion of the TEG. Point A is the open circuit heat flux passing through the portion of the TEG, and point A' is the corresponding open circuit voltage. Point B' is the condition when the voltage is zero, and point B is the corresponding heat flux at zero voltage. Under both of these conditions, the electrical power output of the TEG is zero since either the current or voltage are zero. Point C depicts the hot side heat flux at an intermediate current, such as that which maximizes electrical power output. C' is the corresponding voltage. FIG. 19 shows that the heat flux, and hence the amount of cooling produced by the TEG's extraction of thermal power from the exhaust stream is a function of current. Thus, the temperature of the exhaust stream at the outlet of the TEG system can be adjusted within limits by controlling the current through the TEG. If a control system has the ability to reverse the current, or provide negative voltage, the heat flux can be changed to a greater degree. The TEG can provide the added functionality of modifying the exhaust gas properties and thereby improve overall system performance. For example, the outlet temperature of the C2 stage in FIG. 18 can be adjusted to improve emission control or other function. Under certain temperature and flow conditions not shown in FIG. 19, point D can be somewhat below zero meaning the heat flux is reversed and the TEG heats. Thus, the honeycomb or other catalytic converter attached to a TEG would be heated. Thus, the time to light off or operating temperature could be reduced by applying power to a thermally connected TEG. A regeneration cycle can also be run. A regeneration cycle might be useful particularly if the TEG is integrated into a diesel particulate filter. The TE elements could be used to pump heat into the filter to help remove soot and clean out the filter.

Figure 20:
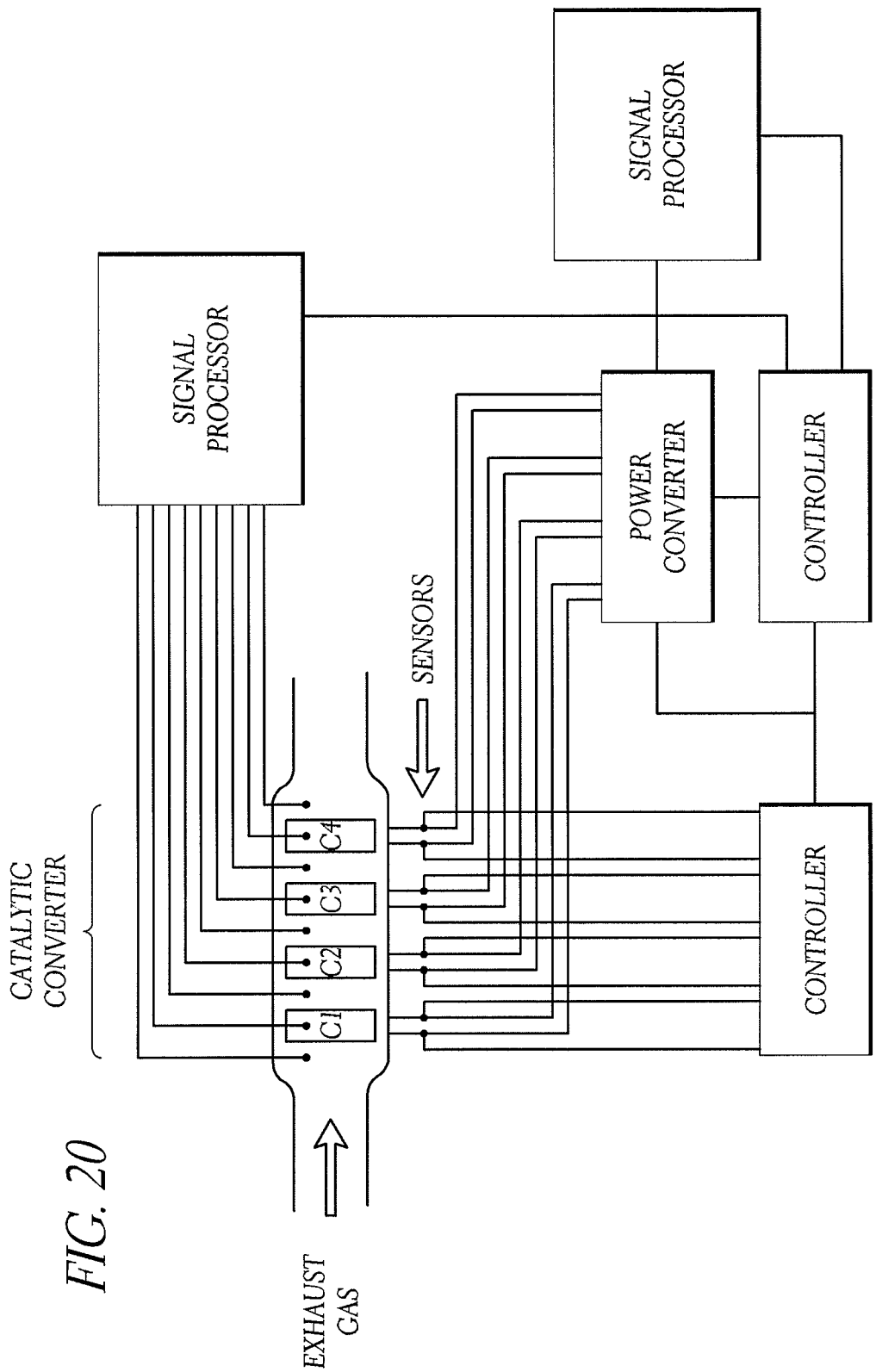
FIG. 20 schematically illustrates an example controller in communication with TEG segments and sensors to optimize operation of the TEG segments in accordance with certain embodiments described herein.

The TEG is in communication with at least one control and at least one power converter. Advantageously, the power controller can both condition power from the TEG to a desired voltage current combination and provide power to the TEG when operating in the mode described above in connection with FIG. 19. The operation of such controller(s) and power converter(s) to modify cooling/heating characteristics, modify power electrical output for control purposes, and any other usage associated with the functions described can be applied to certain embodiments described herein. FIG. 20 depicts an example controller layout in accordance with certain embodiments described herein and shows some of the sensing function inputs that can be used to provide function. The inputs include, but are not limited to, mass flows, pressures, voltages, currents, temperatures, engine RPM, time dependent electrical power usages by a vehicle, engine temperatures, operating conditions. Thus, signals may come from the catalytic converter and/or external sources that may be beneficial to operation of the overall system, such as a vehicle. Similarly, output signals as well as power may be exchanged with external controls and other systems if it is of benefit to do so. As shown in FIG. 20, signal processors may be used to partially process signal information before transferring the information to the controller and/or power converter. Alternatively, the information can be sent without processing to one or more power converters and/or controllers.

Embodiments described herein have several benefits and advantages. Described below are several advantages of certain embodiments. However, not all advantages described below may be applicable to all embodiments described herein.

The thermal losses between the catalytic converter and a separate TEG can be mostly eliminated in certain embodiments. These losses can be large and can amount to up to 40% of the TEG output (see, e.g., Liebl, J., Neugebauer, S., Eder, A., Linde, M., Mazar, B., Stutz, W., "The Thermoelectric Generator from BMW is Making Use of Waste Heat", *MTZ*, Volume 70, 04/2009, pg 4-11).

The response time of the TEG of certain embodiments can be much shorter, which can further increase output in transient conditions such as at engine warm up. Such gains can be critical to performance in European and US standard government drive cycles where the output of present TEGs is delayed and only provides limited benefit near the end of the cycle (see, e.g., "BSST LLC Project Phase 1 Report: High Efficiency Thermoelectric Waste Energy Recovery System for Passenger Vehicle Applications", Jun. 1, 2005, US DOE Freedom Car Program, the entirety of which is hereby incorporated by reference and reproduced in the Appendix).

The TEG of certain embodiments absorbs thermal power from the exhaust stream and cools the exhaust stream. If the amount of cooling is managed by an appropriate controller, a second catalytic converter operating at a lower temperature can be integrated into the catalytic converter package. For example, $NO_x$ emission control can be added into the primary hydrocarbon converter.

Temperature management can be achieved in certain embodiments to meet a variety of important objectives in power train systems. As noted above, temperature control can be used to adjust exhaust temperature through varying (e.g., controlling) the response of the TEG system. FIG. 19 shows the variation in heat transport through a TEG as a function of output current. By controlling the current using the relation illustrated by FIG. 19, the amount of heat removed from the exhaust stream can be varied in certain embodiments in a controllable fashion. Thus, the temperature of the exhaust can be controlled within limits that can adjust temperatures of down stream components, such as $NO_x$ converters. Advantageously, if the current is reversed, the heat transfer rate can be further changed, even reversed, so that temperatures can be adjusted significantly, such as to speed warm up, speed and control catalyst light off, and provide an over temperature control mechanism.

As shown in FIG. 18, the exhaust temperature reduction noted above can be used in certain embodiments to cool all or a controlled portion of the exhaust for diversion to replace the heat exchanger in the EGR system in diesel and gasoline powered engines. This functionality both provides waste heat recovery electric power, and also emission reduction through incorporation of all or a portion of the EGR system into the enhanced catalytic converter assembly.

The temperature control function can also make more practical cogeneration systems comprising of a TEG and a second waste heat recovery system, such as a Rankine cycle converter or the like. The TEG can both produce electrical power and control the exhaust gas temperature to better optimize the performance of an associated co-generator under the varying loads associated with vehicle driving.

Ceramics (silicon carbide (SiC), cordierite, alumina, aluminum nitride (AlN), silicon nitride, etc.), as used in certain embodiments described herein, can have the ability to withstand high temperatures (>500° C.) without melting and decomposing. These materials, particularly those used in commercial ceramic honeycomb, are also designed to withstand thermal shock associated with many high temperature applications. Furthermore, many of these ceramics have significant thermal conductivity to provide effective heat transfer. Another significant benefit of the use of honeycomb as a heat exchanger is its very high heat transfer surface area (up to 900 cells per square inch (cpsi)), making it an effective high temperature heat exchanger.

There are several benefits provided by certain embodiments using an extruded ceramic honeycomb over a metallic heat exchanger with fins brazed inside. Brazing fins inside a tube or box can be expensive, and thermal expansion coefficient of the fins, the shell and the braze material can be difficult to properly match. There is also the potential temperature limitations of the braze choice and an associated contact resistance between the fin and the shell wall. An extruded ceramic honeycomb does not have any of these constraints. It is extruded as one piece, so it does not have any contact resistance concerns between its cells and the cell walls. It does not have thermal expansion concerns since it is all made of one material. It has fewer temperature limitations since ceramics can survive up to temperatures often significantly greater than 1000° C. They can also be significantly less expensive than a brazed heat exchanger since the extrusion process can be quite inexpensive once it is setup, and there are already many commercial applications that use ceramic honeycomb including catalytic converters and diesel particulate filters.

Another significant benefit provided by certain embodiments using the ceramic honeycomb as heat exchanger member in a thermoelectric device is the way electrical isolation between the heat exchanger and the TE material is provided to avoid electrical shorts that prevent electrical current from flowing through the TE material. In standard thermoelectric devices, an additional ceramic substrate is used to provide this electrical isolation, adding weight, cost, and thermal resistance to the device. If the heat exchanger is metallic, an electrically isolating coating can be added to try to reduce the weight, cost, and thermal resistance of the substrate, but at high temperatures (for example, greater than or equal to about 500° C.) it may be difficult to find an electrically isolating coating that can be effectively applied to a suitable heat transfer metallic surface without cracking or peeling off due to poor adhesion or thermal expansion mismatch. Furthermore, such coatings are often thermally isolating as well as electrically isolating making for poor thermal contact between the TE material and the heat exchanger. The addition of a coating also adds inevitable contact resistance. Many ceramic honeycomb would not require any further electrical isolation since the ceramic is already electrically isolating. This reduces the weight, cost, and thermal resistance of the heat exchanger and simplifies the design. Even if the ceramic is not fully electrically isolating like SiC, an additional electrically isolating ceramic coating can be applied that will be more sustainable since it is ceramic to ceramic and the thermal expansion coefficients can be made similar. Thus, the thermoelectric elements can be more directly connected to the heat source.

Discussion of the various embodiments disclosed herein has generally followed the embodiments illustrated in the figures. However, it is contemplated that the particular features, structures, or characteristics of any embodiments discussed herein may be combined in any suitable manner in one or more separate embodiments not expressly illustrated or described. For example, it is understood that a TEG can be connected to the exhaust stream of any power plant or to a heat source other than an exhaust stream. A system incorporating a TEG can include one or more control systems, one or more other generators, and other features in addition to the features disclosed herein. In many cases, structures that are described or illustrated as unitary or contiguous can be separated while still performing the function(s) of the unitary structure. In many instances, structures that are described or illustrated as separate can be joined or combined while still performing the function(s) of the separated structures.

It should be appreciated that in the above description of embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that any claim require more features than are expressly recited in that claim. Moreover, any components, features, or steps illustrated and/or described in a particular embodiment herein can be applied to or used with any other embodiment(s). Thus, it is intended that the scope of the inventions herein disclosed should not be limited by the particular embodiments described above, but should be determined only by a fair reading of the claims that follow.

What is claimed is:

1. A power generation apparatus for a vehicle having an engine, the apparatus comprising:
   at least one exhaust conduit configured to contain a flow of engine exhaust fluid, the at least one exhaust conduit comprising a first region having a first exhaust fluid pressure drop and a second region having a second exhaust fluid pressure drop less than the first exhaust fluid pressure drop;
   at least one heat exchanger in thermal communication with engine exhaust fluid in the first region;
   an array of thermoelectric elements in thermal communication with the at least one heat exchanger;
   a heat transfer enhancement structure within the second region and in thermal communication with the array of thermoelectric elements, the heat transfer enhancement structure configured to transfer heat from the exhaust fluid in the second region;
   at least one valve configured to adjust engine exhaust fluid flow through the first region and the second region; and
   a controller configured to actuate the at least one valve based on at least one engine operating parameter.

2. The apparatus of claim 1, wherein the at least one engine operating parameter is selected from a group consisting of: engine exhaust fluid flow rate, engine exhaust backpressure, and heat extraction from the exhaust fluid.

3. The apparatus of claim 1, wherein the engine comprises an electrical device configured to receive electrical power from the array of thermoelectric elements.

4. The apparatus of claim 1, wherein the controller is configured to actuate the at least one valve to allow engine exhaust fluid to flow through the second region upon an engine exhaust flow rate being great enough to result in back pressure of the apparatus greater than a predetermined back pressure limit.

5. The apparatus of claim 1, wherein the controller is configured to actuate the at least one valve to apportion engine exhaust fluid flow between the first region and the second region to keep back pressure of the apparatus within predetermined limits while optimizing heat extraction from the engine exhaust fluid under operating ranges of engine exhaust fluid temperature and engine exhaust fluid mass flow rate.

6. The apparatus of claim 1, further comprising at least one coolant conduit in thermal communication with the array of thermoelectric elements, the at least one coolant conduit comprising an inner tube and an outer tube in thermal communication with one another, wherein the outer tube has a greater diameter than the inner tube.

7. The apparatus of claim 1, further comprising a sleeve between the first region and the second region, the sleeve in thermal communication with the heat transfer enhancement structure in the second region and the at least one heat exchanger in the first region.

8. The apparatus of claim 7, wherein the heat transfer enhancement structure comprises a plurality of fins in thermal communication with the sleeve, wherein the heat transferred from the exhaust fluid in the second region by the plurality of fins is directed through the sleeve to the array of thermoelectric elements via the at least one heat exchanger in the first region.

9. The apparatus of claim 1, wherein the first region and the second region are configured to allow parallel fluid flow of the engine exhaust fluid through the first region and the second region.

10. The apparatus of claim 1, wherein the at least one exhaust conduit comprises an exhaust tube, the second region comprising a central portion within the exhaust tube and the first region comprising a peripheral portion within the exhaust tube.

11. A method of generating electric power in a vehicle comprising an engine, the method comprising:
   flowing an engine exhaust fluid through at least one exhaust fluid conduit of a power generation system, the at least one exhaust conduit comprising a first region having a first exhaust fluid pressure drop and a second region having a second exhaust fluid pressure drop less than the first exhaust fluid pressure drop, the power generation system comprising at least one heat exchanger in thermal communication with the exhaust fluid in the first region, an array of thermoelectric elements in thermal communication with the at least one heat exchanger, a heat transfer enhancement structure within the second region and in thermal communication with the array of thermoelectric elements, the heat transfer enhancement structure configured to transfer heat from the exhaust fluid in the second region, and at least one valve configured to adjust engine exhaust fluid flow through the first region and the second region; and actuating the at least one valve based on at least one engine operating parameter.

12. The method of claim 11, wherein the at least one engine operating parameter is selected from a group consisting of: engine exhaust fluid flow rate, engine exhaust backpressure, and heat extraction from the exhaust fluid.

13. A power generation apparatus, the apparatus comprising:
- at least one exhaust conduit configured to contain a flow of exhaust fluid, the at least one exhaust conduit comprising a first region having a first exhaust fluid pressure drop and a second region having a second exhaust fluid pressure drop less than the first exhaust fluid pressure drop;
- at least one first heat exchanger in thermal communication with exhaust fluid in the first region;
- at least one second heat exchanger in thermal communication with exhaust fluid in the second region and with the at least one first heat exchanger;
- at least one thermoelectric element in thermal communication with the at least one first heat exchanger; and
- at least one valve configured to be actuated to apportion exhaust fluid flow among the first region and the second region.

14. The apparatus of claim 13, further comprising a controller operably coupled to the at least one valve, the controller configured to adjust the at least one valve based on at least one operating parameter of an engine operably coupled to the apparatus.

15. The apparatus of claim 14, wherein the at least one operating parameter is selected from a group consisting of: engine exhaust fluid flow rate, engine exhaust backpressure, and heat extraction from the exhaust fluid.

16. The apparatus of claim 13, wherein a first thermal path of heat from the exhaust fluid in the first region, through the at least one first heat exchanger, to the at least one thermoelectric element is shorter than a second thermal path of heat from the exhaust fluid in the second region, through the at least one second heat exchanger, through the at least one first heat exchanger, to the at least one thermoelectric element.

17. The apparatus of claim 13, wherein the at least one first heat exchanger is more dense than the at least one second heat exchanger.

18. The apparatus of claim 13, wherein the at least one first heat exchanger and the at least one second heat exchanger are separated by a thermally conductive sleeve.

19. A method of generating electric power, the method comprising:
- flowing an exhaust fluid through at least one exhaust conduit of a power generation system, the at least one exhaust conduit comprising a first region having a first exhaust fluid pressure drop and a second region having a second exhaust fluid pressure drop less than the first exhaust fluid pressure drop, the power generation system comprising:
  - at least one first heat exchanger in thermal communication with exhaust fluid within the first region;
  - at least one second heat exchanger in thermal communication with exhaust fluid within the second region and with the at least one first heat exchanger;
  - at least one thermoelectric element in thermal communication with the at least one first heat exchanger; and
  - at least one valve configured to apportion exhaust fluid flow among the first region and the second region;
- transferring heat from the exhaust fluid in the first region to the at least one thermoelectric element via the at least one first heat exchanger; and
- transferring heat from the exhaust fluid in the second region to the at least one thermoelectric element via the at least one second heat exchanger and the at least one first heat exchanger.

20. The method of claim 19, wherein the exhaust fluid is received from an engine, and the method further comprises actuating the at least one valve based on at least one operating parameter of the engine.

21. The method of claim 20, wherein the at least one operating parameter is selected from a group consisting of: exhaust fluid flow rate, exhaust backpressure, and heat extraction from the exhaust fluid.

22. The apparatus of claim 2, wherein the at least one heat exchanger comprises fins.

23. The apparatus of claim 2, wherein the heat enhancement structure is braised to an inner sleeve of the at least one heat exchanger, the inner sleeve lining an inside surface of the at least one heat exchanger.

24. The apparatus of claim 2, wherein the heat enhancement structure is integral to an inner sleeve of the at least one heat exchanger, the inner sleeve lining an inside surface of the at least one heat exchanger.

* * * * *